(12) United States Patent
Lilak et al.

(10) Patent No.: US 11,742,346 B2
(45) Date of Patent: Aug. 29, 2023

(54) INTERCONNECT TECHNIQUES FOR ELECTRICALLY CONNECTING SOURCE/DRAIN REGIONS OF STACKED TRANSISTORS

(71) Applicant: INTEL CORPORATION, Santa Clara, CA (US)

(72) Inventors: Aaron D. Lilak, Beaverton, OR (US); Gilbert Dewey, Beaverton, OR (US); Cheng-Ying Huang, Hillsboro, OR (US); Christopher Jezewski, Portland, OR (US); Ehren Mannebach, Beaverton, OR (US); Rishabh Mehandru, Portland, OR (US); Patrick Morrow, Portland, OR (US); Anand S. Murthy, Portland, OR (US); Anh Phan, Beaverton, OR (US); Willy Rachmady, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 956 days.

(21) Appl. No.: 16/024,058

(22) Filed: Jun. 29, 2018

(65) Prior Publication Data
US 2020/0006329 A1    Jan. 2, 2020

(51) Int. Cl.
*H01L 27/088* (2006.01)
*H01L 21/768* (2006.01)
(Continued)

(52) U.S. Cl.
CPC .... *H01L 27/0886* (2013.01); *H01L 21/76898* (2013.01); *H01L 21/8258* (2013.01);
(Continued)

(58) Field of Classification Search
CPC ........... H01L 21/76898; H01L 21/8258; H01L 21/845; H01L 23/481; H01L 23/5226;
(Continued)

(56) References Cited

U.S. PATENT DOCUMENTS 9,711,501 B1 * 7/2017 Basker ................ H01L 29/4175
9,837,414 B1   12/2017 Balakrishnan et al.
(Continued)

FOREIGN PATENT DOCUMENTS

| WO | 2016204755 A1 | 12/2016 |
| WO | 2017095409 A1 | 6/2017 |
| WO | 2017111866 A1 | 6/2017 |

OTHER PUBLICATIONS

Extended European Search Report received for EP Application No. 19176629.4, dated Nov. 5, 2019. 9 pages.
(Continued)

*Primary Examiner* — Herve-Louis Y Assouman
(74) *Attorney, Agent, or Firm* — Schwabe, Williamson & Wyatt, P.C.

(57) ABSTRACT

Stacked transistor structures having a conductive interconnect between source/drain regions of upper and lower transistors. In some embodiments, the interconnect is provided, at least in part, by highly doped epitaxial material deposited in the upper transistor's source/drain region. In such cases, the epitaxial material seeds off of an exposed portion of semiconductor material of or adjacent to the upper transistor's channel region and extends downward into a recess that exposes the lower transistor's source/drain contact structure. The epitaxial source/drain material directly contacts the lower transistor's source/drain contact structure, to provide the interconnect. In other embodiments, the epitaxial material still seeds off the exposed semiconductor material of or proximate to the channel region and extends downward into the recess, but need not contact the lower contact structure.
(Continued)

Rather, a metal-containing contact structure passes through the epitaxial material of the upper source/drain region and contacts the lower transistor's source/drain contact structure.

24 Claims, 11 Drawing Sheets

(51) Int. Cl.
| | |
|---|---|
| H01L 21/8258 | (2006.01) |
| H01L 21/84 | (2006.01) |
| H01L 23/48 | (2006.01) |
| H01L 23/522 | (2006.01) |
| H01L 27/092 | (2006.01) |
| H01L 21/8234 | (2006.01) |
| H01L 21/822 | (2006.01) |
| H01L 23/00 | (2006.01) |

(52) U.S. Cl.
CPC .......... *H01L 21/845* (2013.01); *H01L 23/481* (2013.01); *H01L 23/5226* (2013.01); *H01L 24/29* (2013.01); *H01L 24/32* (2013.01); H01L 27/0924 (2013.01); *H01L 24/94* (2013.01); *H01L 2224/29188* (2013.01); *H01L 2224/32145* (2013.01)

(58) Field of Classification Search
CPC ......... H01L 24/29; H01L 24/32; H01L 24/94; H01L 2224/29188; H01L 2224/32145; H01L 27/0886; H01L 27/0924
See application file for complete search history.

(56) References Cited

U.S. PATENT DOCUMENTS

| | | | |
|---|---|---|---|
| 9,997,413 B1* | 6/2018 | Leobandung ... | H01L 21/823871 |
| 11,348,916 B2* | 5/2022 | Lilak .................. | H01L 29/66545 |
| 2003/0129829 A1* | 7/2003 | Greenlaw ............... | H01L 21/84 |
| | | | 438/637 |
| 2005/0248035 A1 | 11/2005 | Son et al. | |
| 2006/0220134 A1* | 10/2006 | Huo .................... | H01L 27/1104 |
| | | | 257/351 |
| 2011/0108803 A1* | 5/2011 | Deligianni ............ | H01L 29/775 |
| | | | 257/24 |
| 2011/0248403 A1* | 10/2011 | Chandrasekaran ..... | H01L 24/94 |
| | | | 257/E21.705 |
| 2014/0027860 A1 | 1/2014 | Glass et al. | |
| 2016/0260802 A1 | 9/2016 | Glass et al. | |
| 2016/0372375 A1 | 12/2016 | Fenouillet-Beranger et al. | |
| 2018/0122793 A1* | 5/2018 | Moroz ................ | H01L 29/0676 |
| 2018/0138200 A1 | 5/2018 | Kim | |
| 2020/0006330 A1* | 1/2020 | Lilak ................... | H01L 29/0847 |

OTHER PUBLICATIONS

Office Action from European Patent Application No. 19176629.4, dated Jul. 20, 2021, 6 pages.

* cited by examiner ial source/drain region. In other
INTERCONNECT TECHNIQUES FOR ELECTRICALLY CONNECTING SOURCE/DRAIN REGIONS OF STACKED TRANSISTORS

BACKGROUND

Integrated circuitry continues to scale to smaller feature dimensions and higher transistor densities. A more recent development with respect to increasing transistor density is generally referred to as three-dimensional (3D) integration, which expands transistor density by exploiting the Z-dimension (build upwards rather than laterally outwards in the X and Y dimensions). Some such 3D integrated circuits are monolithic in nature, in that they are formed utilizing a technique known as layer transfer. Such layer transfer may include, for instance, bond and hydrogen-based or hydrogen/helium based cleave techniques. Another means of performing layer transfer is to bond (such as with an oxide) two distinct wafers (sometimes referred to as host and donor wafers or substrates) and then perform a chemical-mechanical polish (CMP) operation to remove bulk of the bonded wafer leaving only a relatively thin region on the host wafer. This bond and polish operation may also utilize an etchstop embedded within the donor wafer. In any such cases, such 3D integration schemes give rise to a number of non-trivial issues, particularly with respect to forming interconnects between a source and/or drain region of an upper transistor to a source and/or drain region of a lower transistor.

Figure 1:
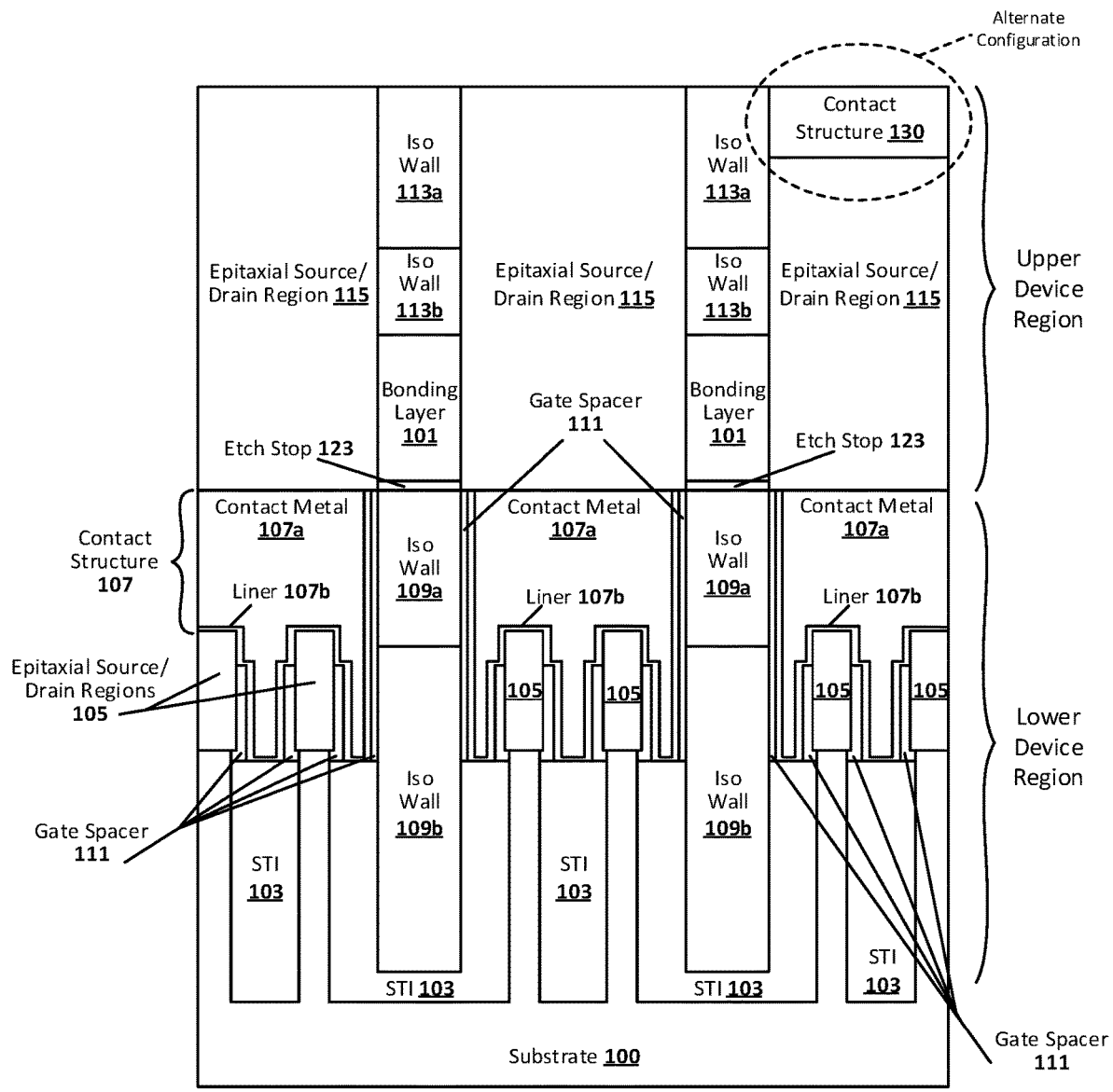
FIG. 1 illustrates a cross-section view of an integrated circuit including a vertical interconnect structure for electrically connecting source/drain regions of stacked transistors, in accordance with an embodiment of the present disclosure. The cross-section is taken parallel to the gate line and through the source/drain regions.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Stacked transistor structures are disclosed herein having a conductive interconnect between a source/drain region of an upper transistor and a source/drain region of a lower transistor. In an embodiment, the interconnect mechanism utilizes space normally consumed by the source/drain region, so as to not require as much or any additional space. In some such embodiments, the interconnect is provided, at least in part, by highly doped epitaxial material deposited in the upper transistor's source/drain region. In such cases, the epitaxial material seeds off of an exposed vertical portion of the upper transistor's channel region (or a remaining stub or portion of semiconductor material adjacent the channel region, as will be discussed in turn) and extends downward into a recess that exposes the lower transistor's source/drain contact structure. Thus, the highly doped epitaxial source/drain material directly contacts the lower transistor's source/drain contact structure, to provide the interconnect. In other such embodiments, the epitaxial material still seeds off the exposed portion of the upper transistor's channel region (or a remaining portion of semiconductor material adjacent the channel region) and extends downward into the recess, but stops short of directly contacting the lower transistor's source/drain contact structure, thereby leaving a void. The epitaxial material is then trimmed to create a recess that terminates into the void, which is subsequently filled with metal that directly contacts the lower transistor's source/drain contact structure.

General Overview

As previously explained, connecting upper and lower source/drain regions of a stacked transistor structure can give rise to a number of non-trivial issues. For instance, one possible solution includes routing contact metal around the source/drain region with a wrap-around construction, while another possible solution includes routing contact metal within the interstitial region between the source/drain region (fin or other semiconductor body) and isolation material. Any such approaches generally necessitate a relatively large amount of area to be dedicated to the interconnect structure, in addition to the area consumed by the source/drain regions themselves.

Thus, stacked transistor structures and methods of forming same are disclosed. In an embodiment, a stacked transistor structure includes an interconnect for electrically connecting the source/drain regions of two vertically stacked transistors (upper and lower transistors). The interconnect mechanism efficiently utilizes space within and under the source/drain region, so as to not require as much or any additional space. The interconnect can be provided by either highly doped epitaxial semiconductor material that effectively connects the upper source/drain region to the lower source/drain contact structure, or by a metal interconnect that passes through the upper source/drain region and down to the lower source/drain contact structure. In either case, the upper epitaxial source/drain region can be seeded from an exposed portion of semiconductor material in the upper channel region (or a remaining stub or portion of semiconductor material adjacent the channel region), rather than the underlying lower source/drain contact. Note that the dimensions of this epitaxial growth can vary (non-uniform deposition). Further note that having the epitaxial growth be non-selective or non-uniform in dimension may allow for greater electrical doping levels to be incorporated. Further note that the epitaxial growth process may be integrated into a source/drain region formation process where place holder source/drain regions are removed and epi source/drain regions are provided.

In more detail, and according to one embodiment, the epitaxial growth provides the upper source/drain region but also extends downward to contact the lower source/drain contact, thereby providing an interconnect between the upper and lower source/drain regions. The epitaxial material is highly doped, which not only provides the desired p-type or n-type doping for the transistor, but can also be used to improve the conductivity of the interconnect. In some such embodiments, a metal contact may be added to the top of the source/drain region.

Note that, in some example embodiments, the exposed portion of the channel region or adjacent semiconductor material from which the epitaxial growth is seeded can be, for instance, outward extending from the side of the gate structure so as to provide by vertical and horizontal surfaces to facilitate better seeding. For instance, a remaining stub or portion of semiconductor material adjacent the channel region, such as a fin stub, may extend out from the gate spacer by, for example, 1 nm to 5 nm. In some such cases, the gate structure materials can be recessed or trimmed back to allow for such protrusion of the exposed semiconductor materials, by way of a selective trim process, for instance. In other example embodiments, the exposed portion of semiconductor material (whether it be the channel region itself or a semiconductor material directly adjacent thereto) may be within the gate spacer (or other gate structure feature, such as a mask or etchstop layer), so as to allow for introduction of source/drain dopant closer to the channel region. In still other example embodiments, the exposed portion of the semiconductor material may be flush with the gate structure. In a more general sense, the exposed portion of the semiconductor material (whether it be the channel region itself or semiconductor material adjacent thereto) can have any configuration that allows for seeding of the highly doped epitaxial source/drain material to take place.

In some such embodiments where the epitaxial growth extends down to the lower source/drain contact structure, a metal conductor may be optionally added for a top side of the upper source/drain region. In some such cases, the epitaxial source/drain region can be recessed a bit to provide a contact trench, and the metal contact can be formed in that contact trench.

In another embodiment, the epitaxial growth still seeds from the exposed channel region or semiconductor material adjacent thereto as previously described and provides the upper source/drain region, but only extends partially downward toward the lower source/drain contact. This leaves a space or void between the upper source/drain region and the lower source/drain contact structure. A central portion of the epitaxial source/drain material is then trimmed (e.g., via a spacer-based etch process) so as to provide a vertical recess that passes through the upper source/drain region and terminates into the space/void below, thereby exposing the underlying lower source/drain contact structure. A metal conductor is then deposited to fill that recess and void, thereby creating an interconnect between the upper source/drain region and the lower source/drain contact structure. In some such cases, note that the metal may not fill the entire void. For instance, in some embodiments, there is a relatively small void or airgap under the spacerized source/drain material.

In any such embodiments, the source/drain material may be the same as, or compositionally different from, the exposed semiconductor material to which seeding is desired. In addition, the source/drain material may be heavily doped to accommodate a desired polarity (NMOS or PMOS) while the channel region material may be undoped or otherwise minimally doped. In one example embodiment, the channel material is undoped silicon and the epitaxial source/drain material is a boron-doped silicon germanium (SiGe). In one such case the germanium concentration can be graded from some low level (e.g., less than 20 atomic percent) to a desired higher level (greater than 50 atomic percent), to improve seeding on exposed silicon at or otherwise adjacent to the channel region. In another example embodiment, the channel material is undoped gallium arsenide (GaAs) and the epitaxial source/drain material is indium gallium arsenide (InGaAs). In one such case the indium concentration can be graded from some low level (e.g., less than 5 atomic percent) to a desired higher level (greater than 50 atomic percent), to improve seeding on GaAs at or otherwise adjacent to channel region. The dopant concentration can be set and varied as desired, as will be further appreciated. Numerous such material systems and variations will be apparent in light of this disclosure.

In any such cases, the resulting stacked transistor structure can be configured with top and bottom non-planar transistor structures, such as FinFETs (tri-gate, double-gate) and gate-all-around transistor devices (nanowires, nanoribbons). In complementary metal oxide semiconductor (CMOS) configurations, one of the top or bottom can be PMOS and the other of the top or bottom can be NMOS. In other embodiments, the top and bottom transistors may be the same type (both PMOS or NMOS), depending on the integrated circuit being fabricated. In some specific example cases, the upper transistors are PMOS transistors having group IV semiconductor materials, and the lower transistors are NMOS transistors having group III-V semiconductor materials.

Gate-first and gate-last processes, as well as etch-and-replace epitaxial source and drain processes, may be used, as will be appreciated. The top and bottom gate structures may be the same in some embodiments, and different in other embodiments such as in cases that utilize a CMOS configuration where, for example, the top gate structure has a p-type work function metal and the bottom gate structure has an n-type work function metal, or some other difference. The bottom transistor devices can be formed separately, and then that resulting structure can be bonded to another wafer or substrate upon which the upper transistor devices reside. An etch stop layer to which the bonding layer is bonded can be used to protect the bottom transistor devices. So, and according to some embodiments, the source and drain regions and corresponding contact structures associated with the top channel region can be processed after the source/drain regions and corresponding contact structures associated with the bottom channel region are formed, and after the wafer/substrate bonding process is carried out.

One advantage of the techniques provided herein, according to some embodiments, is that they allow for a low-resistivity contact to be formed vertically between stacked devices (whereas other approaches may not). This is especially the case in embodiments where the source/drain epitaxial deposition is trimmed and filled with a metal interconnect feature. A second advantage of this approach is that it does not rely upon epitaxial growth seeded from a metal.

Materials that are compositionally different as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally different may further refer to two materials that have different crystallographic orientations. For instance, (110) silicon is different from (100) silicon. Creating a stack of different orientations could be accomplished, for instance, with blanket wafer layer transfer.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Architecture and Methodology

FIG. 1 illustrates a cross-section view of an integrated circuit including a vertical interconnect structure for electrically connecting source/drain regions of stacked transistors, in accordance with an embodiment of the present disclosure. The cross-section is taken parallel to the gate line and through the source/drain regions. As can be seen, this example configuration includes a monolithically stacked transistor architecture that includes upper and lower device regions bonded to one another by way of a bonding layer. Note, however, that any number of layer transfer or other forming methods (including hydrogen-based or hydrogen/helium based cleave techniques) can be utilized to provide the monolithically stacked transistor architecture, and the techniques provided herein can be readily integrated, for instance, into the source/drain processing of the upper device region, as will be appreciated in light of this disclosure. As will be further appreciated, the example embodiment is shown as including fins, but other embodiments may be configured with nanowires or nanoribbons.

The lower device region of this particular example embodiment includes a substrate 100 having a number of fins extending upward therefrom. The fins are grouped in pairs in this example case, but in other embodiments may be single fins or some other grouping of fins. In still other embodiments, the fins may be configured as multilayer stacks suitable for forming nanowires or nanoribbons. In any such cases, the individual fins are isolated from one another by shallow trench isolation (STI) 103. In addition to the STI 103, the fin pairs (or other fin groups) are further isolated from one another by isolation walls 109, which generally include portions 109*a* and 109*b*. In addition to providing isolation, isolation walls 109 provide etch selectivity with respect to STI 103, as will be discussed in turn. Each fin has an epitaxial source/drain region 105 thereon. A contact structure 107 is provided on the source/drain regions 105 of each fin pair, and includes a contact metal 107*a* and a conductive liner 107*b*. Also shown in this particular cross-section are gate spacers 111, which may be adjacent to the source/drain regions 105. The gated channel regions are not shown in this cross-section but will be apparent. As will be further appreciated, the gate spacer may or may not be evident in the source/drain cut as shown depending upon where the cut is taken. For low contact resistance, the gate spacer 111 can be removed from the source/drain regions 105. In some such example cases, the gate spacer 111 may only be removed from the upper regions of source/drain regions 105 or only in the region of source/drain 105 material that is in close proximity (e.g., within 5 nm) to the gate.

The upper device region generally includes similar transistor features as to the lower device region, including one or more gated channel regions between source and drain regions. In this example configuration, the upper device region is bonded by bonding layer 101 to an etch stop layer 123 provided on the top surface of the lower device region. In this example embodiment, the epitaxial source/drain regions 115 provide not only the upper source/drain regions, but also provide the interconnect from the upper source/drain regions to the lower contact structure 107. In some embodiments, the epitaxial source/drain region may be recessed and have a contact structure 130 thereon. Isolation walls 113 (including portions 113*a* and 113*b*) electrically separate the upper source/drain regions, with help from bonding layer 101.

Any number of suitable substrates can be used to implement substrate 100, including bulk substrates, semiconductors-on-insulator substrates (XOI, where X is a semiconductor material such as silicon, germanium, or germanium-enriched silicon), and multi-layered structures, including those substrates from which fins or nanowires can be formed prior to a subsequent gate patterning process. In some specific example cases, the substrate 100 is a germanium or silicon, SiGe, or GaAs bulk substrate, or a germanium or silicon or SiGe or GaAs on oxide substrate. In other specific example cases, the substrate 100 is a multilayer structure of Si and SiGe, or III-V materials such as gallium nitride and InGaAs. In still other example cases, the substrate 100 is a semiconducting oxide such as nickel oxide or indium gallium zinc oxide (IGZO). Although a few examples for substrate 100 are described here, other suitable materials and configurations can be used, as will be appreciated.

The fins on the substrate can be formed, for example, using standard mask and etch techniques to provide fins that are native to the substrate. In such cases, the fins will have the same material composition as the substrate, and the example materials previously noted are equally applicable here. In other such cases, the native fins are treated as place holder fins and are etched out and replaced with epitaxial replacement fins using a so-called aspect ratio trapping (ART) based fin forming process. Example ART-based semiconductor fin forming techniques are provided, for instance, in U.S. Patent Application Publication 2014/0027860. In some such ART-based cases, the replacement fin material is provided as alternating layers of desired channel material and sacrificial/inactive material such as described in U.S. Patent Application Publication 2016/0260802. Such multilayer fins are particularly useful for forming nanowire and nanoribbon transistors (e.g., during final gate processing, prior to deposition of final gate materials). In some such example cases, the multilayer fins comprise alternating layers of SiGe and silicon, with one of these materials being sacrificial (e.g., silicon for PMOS and SiGe for NMOS) and the other being the nanowire/nanoribbon channel material (silicon for NMOS and SiGe for PMOS). In some ART-based cases, a first set of fins or multilayer fin structures is formed with a first semiconductor material system (e.g., material having a high-germanium concentration for p-type non-planar transistor devices), and a second set of fins or multilayer fin structures is formed with a second semiconductor material system (e.g., material having a high silicon or indium concentration for n-type non-planar transistor devices). Any number of fin and/or multilayer fin structure forming processes can be used in the context of the present disclosure, as will be appreciated. In a more general sense, the fins and/or fin structures can be any materials suitable for a given stacked transistor integrated circuit application.

STI 103 can be any suitable insulator material, such as silicon dioxide, silicon nitride, silicon carbide, silicon oxynitride, a polymer, a porous version of any of these, or any combination of these (e.g., upper portion of silicon oxide and a lower portion of silicon nitride, or vice-versa). Isolation walls can be implemented, for example, with any materials that provide etch selectivity with respect to STI 103. For instance, in one such example embodiment, STI 103 is silicon dioxide, iso wall 109a is hafnium oxide or some other relatively high-k dielectric that has a lower etch rate than silicon dioxide, and iso wall 109b is silicon nitride or some other insulator having a lower etch rate than silicon dioxide as well as a lower dielectric constant than iso wall 109a. Other embodiments may have isolation wall 109 configured differently, such as to provide etch selectivity without constraint on the dielectric constant. Still other embodiments may have fewer or no isolation walls 109. In addition, note in the example embodiment shown that isolation walls 109 are provided between fin pairs. In other embodiments, there may be an isolation wall between each fin, or between every three fins, or some other configuration as will be appreciated.

In any such cases, note that the materials making up STI 103 and isolation walls 109 can be provided via atomic layer deposition (ALD) to provide a conformal or otherwise relatively uniform deposition, according to some embodiments. Using such a conformal deposition process, note that the isolation walls are effectively self-aligned within the corresponding body of STI 103 material. In one example embodiment, STI 103 (insulator oxide) is conformally deposited to a certain vertical thickness (e.g., 10 to 50 nm), followed by conformal deposition of iso wall 109b (etch resistant material such as insulator nitride), such that in areas between fin pairs, the iso wall 109b material closes the remaining gap between the STI 103 material and pinches off on itself. Further note that the smaller space between two fins of a given fin pair is completely filled by the STI 103 material, given the nature of the spacing (pitch). Iso wall 109a material is then conformally deposited. Any excess materials can be planarized off. Other deposition techniques such as chemical vapor deposition (CVD) and physical vapor deposition (PVD) can be used as well, but may necessitate an alignment aspect to the forming process for isolation walls 109, as will be appreciated The lower gate structure (of which only the gate spacer 111 is showing) can be implemented with any standard processes and materials, including both gate-first and gate-last processes. For instance, in one example embodiment, the gate structure is formed using a gate-last (or so-called remove metal gate or RMG process) and includes gate spacers 111, a gate dielectric, and a gate electrode (gate dielectric and gate electrode are not shown in this particular cross-section, but will be apparent). The gate structure may further include a hard mask on top of the gate electrode (and any exposed gate dielectric). Any number of gate structure configurations can be used. The gate spacers 111 may be, for example, silicon nitride or silicon dioxide or a carbon-doped oxide or an oxynitride or a carbon-doped oxynitride. The gate dielectric may be, for example, any suitable gate dielectric material such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used. Further, the gate electrode may comprise a wide range of suitable metals or metal alloys, such as aluminum, tungsten, titanium, tantalum, copper, titanium nitride, or tantalum nitride, for example. In some embodiments, the gate dielectric and/or gate electrode may include a multilayer structure of two or more material layers or components. For instance, in one such embodiment, the gate dielectric is a bi-layer structure having a first dielectric material (e.g., silicon dioxide) in contact with the channel region and a second dielectric material (e.g., hafnium oxide) in contact with the first dielectric material, the first dielectric material having a dielectric constant that is lower than the dielectric constant of the second dielectric material. Likewise, the gate electrode structure may include a central metal plug portion (e.g., tungsten) with one or more outer work function layers and/or barrier layers (e.g., tantalum, tantalum nitride, or other work function material to optimize for p-type or n-type performance as is sometimes done), and/or a resistance reducing cap layer (e.g., copper, gold). In some embodiments, the gate dielectric and/or gate electrode may include grading (increasing or decreasing, as the case may be) of the concentration of one or more materials therein. In a gate-last process, the final gate structure can be provided after the source/drain processing as variously provided herein is completed. Numerous different gate structure configurations can be used, as will be apparent in light of this disclosure.

As can be further seen in the example embodiment depicted in FIG. 1, the source/drain regions 105 are epitaxial source/drain regions that were provided after a portion of the fin or fin structure was isolated and etched away or otherwise removed. The source/drain 105 material can therefore be compositionally different from the underlying fin/substrate 100 material and/or the channel material (not shown in this particular cross-section, as the channel is under the gate structure). In other embodiments, the source/drain regions 105 may be doped portions of the fin or fin structure, rather than epi source/drain regions. In some embodiments using an etch and epitaxial replacement process, the source/drain regions 105 are faceted and overgrown from a trench within insulator material (e.g., STI 103), and the corresponding source or drain contact structure 107 lands on that faceted excess portion. Alternatively, in other embodiments, the faceted excess portion of epi source/drain regions 105 can be removed (e.g., via chemical mechanical planarization, or CMP), and the corresponding source or drain contact structure 107 lands on that planarized portion. As will be further appreciated, in some embodiments, the removal of the original source/drain regions and replacement with epi source/drain 105 material may result in an upper portion of the source/drain region (the overgrowth portion of the epi deposition) which is wider (e.g., by 1-10 nm) than the underlying fin structure width. Any combination of such features may result.

The epi source/drain regions 105 can be any suitable semiconductor material. For instance, PMOS source/drain regions may include, for example, group IV semiconductor materials such as silicon, germanium, SiGe, SiGe alloyed with carbon (SiGe:C). Example p-type dopants in silicon, SiGe, or germanium include boron, gallium, indium, and aluminum. NMOS source/drain regions may include, for example, group III-V semiconductor materials such as two or more of indium, aluminum, arsenic, phosphor, gallium, and antimony, with some example compounds including but not limited to indium aluminum arsenide (InAlAs), indium arsenide phosphide (InAsP), InGaAs, indium gallium arsenide phosphide (InGaAsP), gallium antimonide (GaSb), gallium aluminum antimonide (GaAlSb), indium gallium antimonide (InGaSb), or indium gallium phosphide antimonide (InGaPSb). In some specific such example embodiments, for instance, substrate 100 material is germanium, and source/drain regions 105 comprise SiGe (e.g., $Si_{1-x}Ge_x$ where $0.20 \leq x \leq 0.99$; or $Si_xGe_y:C_z$ where $8 \leq x \leq 16$; $80 \leq y \leq 90$; $1 \leq z \leq 4$; $x+y+z=100$). In another embodiment, substrate 100 material could be, for instance, $In_xGa_{1-x}As$ $0.51 \leq x \leq 0.55$; $0.10 \leq y \leq 1.00$ or InAs, and source/drain regions 105 comprise an indium-containing compound (e.g., $In_yAl_{1-y}As$ where $0.60 \leq y \leq 1.00$; or $InAs_yP_{1-y}$ where $0.10 \leq y \leq 1.00$; $In_yGa_{1-y}As_zP_{1-z}$ where $0.25 \leq y \leq 1.00$ and $0.50 \leq z \leq 1.00$; $In_xGa_{1-x}Sb$ where $0.25 \leq x \leq 1.00$, or $In_xGa_{1-x}P_ySb_{1-y}$ where $0.25 \leq x \leq 1.00$; $0.00 \leq y \leq 0.10$). Example N-type dopants include phosphorus, arsenic, and antimony. In still other embodiments, the transistors in the lower device region include NMOS and PMOS transistors both implemented with group IV materials, or just NMOS transistors implemented with group IV materials, or just PMOS transistors implemented with group IV materials. In a more general sense, source/drain regions 105 can be any semiconductor material suitable for a given application.

In some cases, the epi source/drain regions 105 may include a multilayer structure, such as a germanium cap on a SiGe body, or a germanium body and a carbon-containing SiGe spacer or liner between the corresponding channel region and that germanium body. In any such cases, a portion of the epi source/drain regions 105 may have a component that is graded in concentration, such as a graded germanium concentration to facilitate lattice matching, or a graded dopant concentration to facilitate low contact resistance. Any number of source/drain configurations 105 can be used as will be appreciated in light of this disclosure, and the present disclosure is not intended to be limited to any particular such configurations.

The source/drain contact structures 107 can have any number of standard configurations. In this example embodiment, the contact structures 107 include a contact metal 107a and a liner 107b. The liner 107b (sometimes called a barrier layer) can be, for example, tantalum or tantalum nitride, and metal 107a can be any suitable plug/core material, such as tungsten, aluminum, ruthenium, cobalt, copper, or alloys thereof. In some cases, note the liner 107b can be tuned to a given polarity. For instance, according to some such embodiments, liner 107b can be titanium for NMOS source/drain contact structures, or nickel or platinum for PMOS source/drain contact structures. Further note that liner 107b is conformal in nature and extends over the exposed portion of the gate spacer 111 and the isolation wall 109, in this example embodiment. Further note in this example embodiment that the gate spacer 111 material is also between the liner and the isolation wall 109. Other embodiments may be configured differently, as will be appreciated. In still other embodiments, the contact structures 107 can be optimized p-type and n-type contact structures similar to p-type and n-type gate electrode structures, and/or include resistance reducing materials (e.g., nickel, platinum, nickel platinum, cobalt, titanium, germanium, nickel, gold, or alloys thereof such as germanium-gold alloy, or a multilayer structure of titanium and titanium nitride all have good contact resistance), in addition to contact metal 107a and liner 107b. Any number of suitable source/drain contact structures 107 can be used in accordance with an embodiment of the present disclosure, as will be appreciated, and the present disclosure is not intended to be limited to any particular such contact structure configurations.

An etch stop layer 123 is provided on the top of the lower device region, which can be, for example, silicon nitride or silicon carbide or some other suitable etch stop material. In some cases, the etch stop 123 provides etch selectivity with respect to the bonding layer 101. Note that the etch stop 123 may also act as a passivation layer to protect the lower device region during the layer transfer process. In some embodiments, etch stop material 123 may not be present and the bonding layer 101 is used for direct contact to the lower layers. Isolation wall 113, including portions 113a and 113b, can be provisioned in a similar manner as isolation wall 109, wherein previously relevant discussion with respect to portions 109a-b equally apply to portions 113a-b.

As will be appreciated, the upper device region shown in FIG. 1 can be formed using similar processes, materials and configurations as discussed with respect to the lower device region, and that relevant discussion is equally applicable here. Just as with the lower device region, the channel regions of the upper device region may be gated with any number of standard gate structures, and may be planar or non-planar (e.g., fins, nanowires, nanoribbons). According to an embodiment, and as will be further appreciated, the source/drain processing for the upper device layer is performed after the layer transfer process is complete to form the stacked transistor structure. In the example embodiment shown, a bonding layer 101 is used to bond the upper device region to the etch stop layer 123 of the lower device region. The bonding layer can be, for example, silicon dioxide, although any number of bonding layers can be used, such as those that provide etch selectivity with respect to the etch stop, if such etch selectivity is desired, and as will be appreciated.

Once the upper and lower device regions are bonded or otherwise integrated into a monolithic stacked structure, the upper epitaxial source/drain regions 115 can be formed. In some embodiments, this entails removing placeholder source/regions to expose a vertical length of the channel region (or semiconductor material adjacent to the channel region) and epitaxially growing source/drain regions 115 therefrom, thereby forming the structure shown in FIG. 1. In the example case shown, all three depicted source/drain regions 115 extend down to physically contact the contact structures 107 of the lower device region, thereby providing interconnection therebetween. In other embodiments, only select ones of the source/drain regions 115 may be so configured (i.e., in some cases, interconnect between the upper and lower source/drain regions is not desired). In cases where there is no interconnect, there may be, for instance, one or more layers of insulator material between the upper source/drain region 115 and the lower contact structure 107.

As can further be seen in the upper right corner of FIG. 1, in some embodiments, the epitaxial source/drain region 115 may be recessed to and a contact structure 130 may be formed in that recess. The contact structure 130 may be, for example, similar to contact structures 107, and that discussion is equally applicable here. In still other example embodiments, the contact structure is deposited or otherwise formed on top of the source/drain region 115, without recessing the source/drain region 115. Note, however, that such a contact structure is not needed, as source/drain region 115 material is sufficiently conductive to provide an electrical contact. To this end, source/drain region 115 material may be heavily doped to improve conductivity. In some cases, the concentration of the dopant (such as boron or magnesium or other suitable dopant) may be graded so as to provide higher concentrations proximate the interface with the underlying contact structure 107 and/or proximate the interface with the overlying contact structure 130. Doping concentration proximate the channel region can also be increased if so desired, to facilitate improved mobility.

Further details as to how epi source/drain regions 115 are formed will be provided with respect to FIGS. 2a-d. Further note, however, that the various other details provided herein for the upper and lower device regions are provided for example purposes only, and are not intended to limit the present disclosure. Rather, the source/drain interconnect techniques provided herein can be used with any number of vertically stacked transistor architecture configurations. For instance, and as will be appreciated, the specific configuration of the lower and upper device regions with respect to variables such as semiconductor materials used (e.g., group IV semiconductor materials, group III-V semiconductor materials, etc), type of channel regions used (e.g., fin, nanowire, nanoribbon, planar), type of substrates used (e.g., bulk, silicon-on-insulator, etc), type of fins used (e.g., native to substrate, replacement fins, multilayer fins, etc), usage of isolation walls, and location of source/drain interconnects between upper and lower devices, will vary from one embodiment to the next, and the present disclosure is not intended to be limited to any such configurations.

FIGS. 2a-2d collectively illustrate a methodology for forming vertical contact or so-called interconnect between monolithically stacked transistors, according to an embodiment of the present disclosure. The cross-sections are taken parallel to the gate line and through the source/drain regions. The previous relevant discussion corresponding to FIG. 1 with respect to example materials and configurations and forming processes is equally applicable here.

Figure 2A:
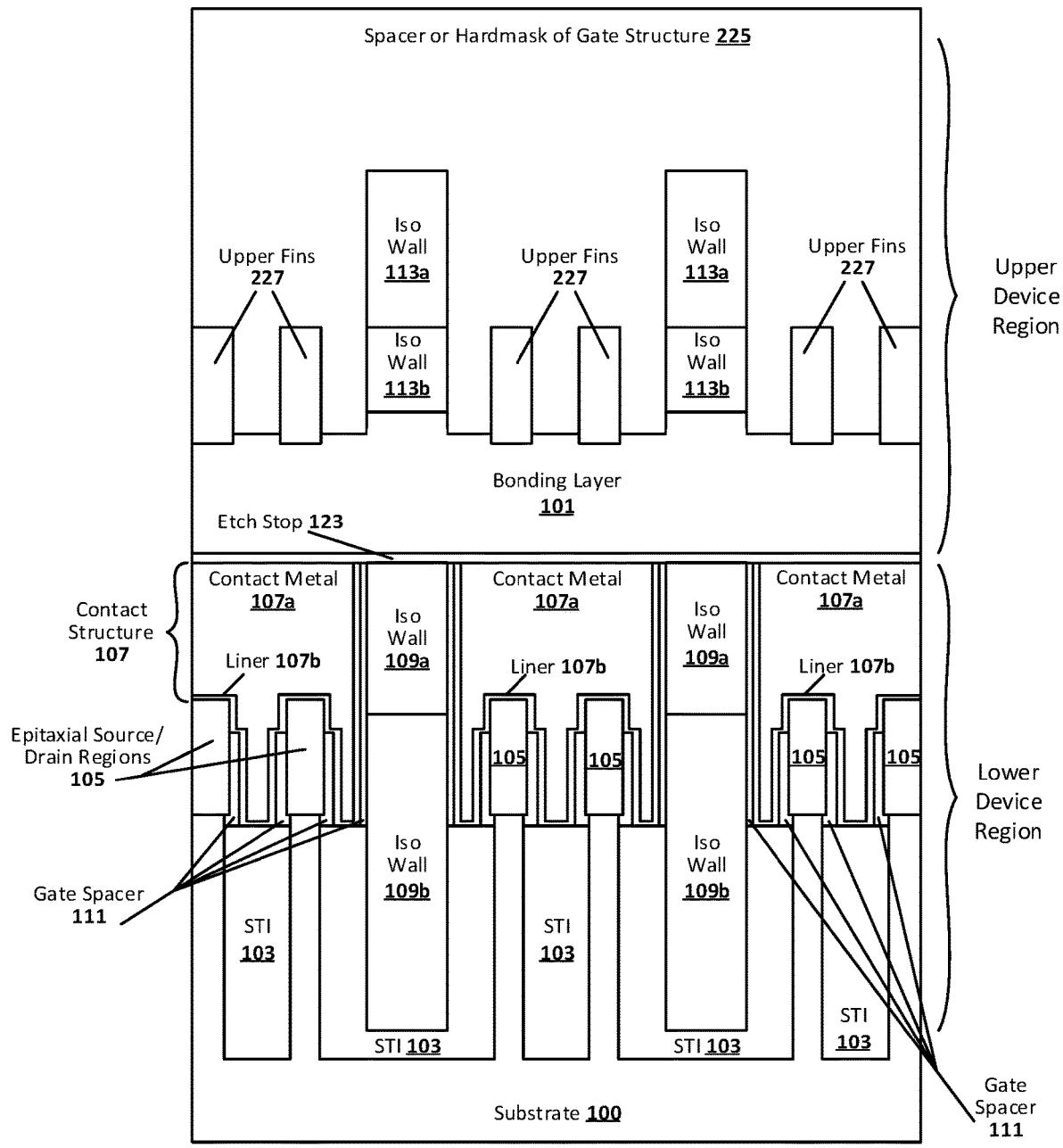
FIGS. 2a-2d collectively illustrate a methodology for forming the integrated circuit of FIG. 1, in accordance with an embodiment of the present disclosure. The cross-sections are taken parallel to the gate line and through the source/drain regions.

With reference now to FIG. 2a, a partially formed integrated circuit is shown that includes upper and lower device regions in a monolithically stacked configuration. At this point in the process, the lower device region has been separately formed, and is now bonded to the upper device region by bonding layer 101. As can further be seen, the source/drain regions of the upper device have been opened or otherwise exposed to reveal fins 227 in preparation for further processing, as will be discussed in turn. The depth of the etch can vary from one embodiment to the next, but in some example cases is 20 to 80 nm. In a more general sense, the depth of the etch is sufficient to expose the source/drain region corresponding to the gated channel region. As a result of this opening, the gate structure 225 is also exposed in the background. Depending on how the gate structure 225 is configured, the exposed portion may be, for instance, the gate spacer or hardmask. In any case, the exposed fins 227 are thus shown protruding from the gate structure 225. The isolation walls 113 are provisioned between fin pairs in this example case, but may be differently configured as previously noted (between each fin, or every three fins, or only between certain fins or fin groups). This opening of the source/drain region can be carried out, for instance, by performing a wet and/or dry etch that removes insulator materials (e.g., silicon dioxide) covering the fins 227. In some embodiments, this etch is selective to the gate structure 225 and isolation wall 113 materials (as well as any other exposed materials) and removes the insulator material covering fins 227 at a much higher rate. In other embodiments, a mask can be patterned that isolates the source/drain regions to be processed, while protecting other areas from the etchant.

As previously explained, although fins are shown in the upper and lower device regions, other embodiments may have multilayer fin structures (such as those sometimes used in nanowire or nanoribbon transistor configurations) or planar channel regions. Further note that, in the example embodiment shown, the upper fins appear to be aligned with the lower fins. Such alignment is not necessary, as will be appreciated. For instance, in other embodiments, the upper fins, fin structures or other semiconductor bodies are not aligned with the lower fins, fin structures or other semiconductor bodies, and as such an interconnect from an upper source/drain region only partially lands on the underlying contact structure to provide electrical contact, which is fine.

Figure 2B:
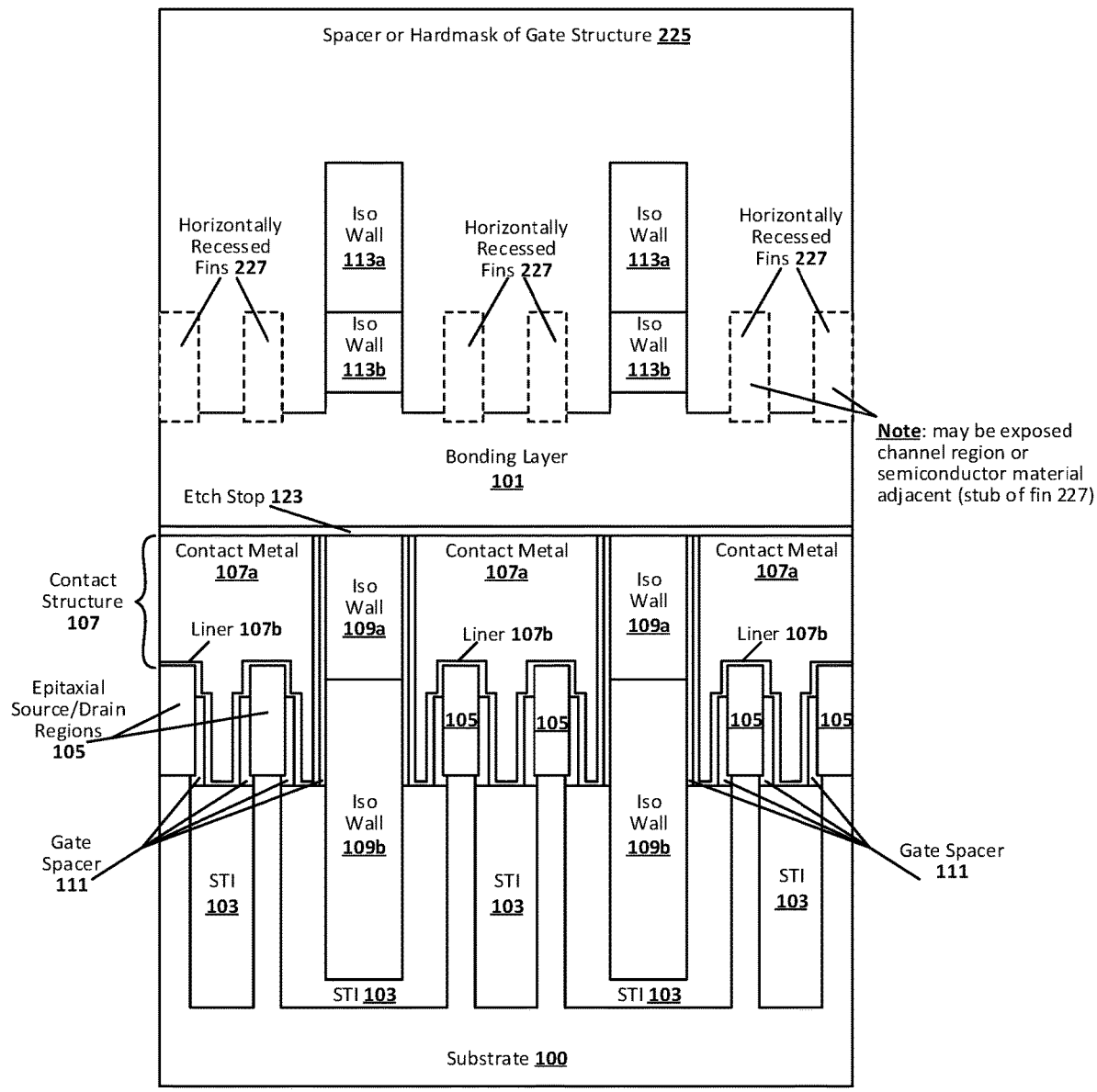
Figure 2B:
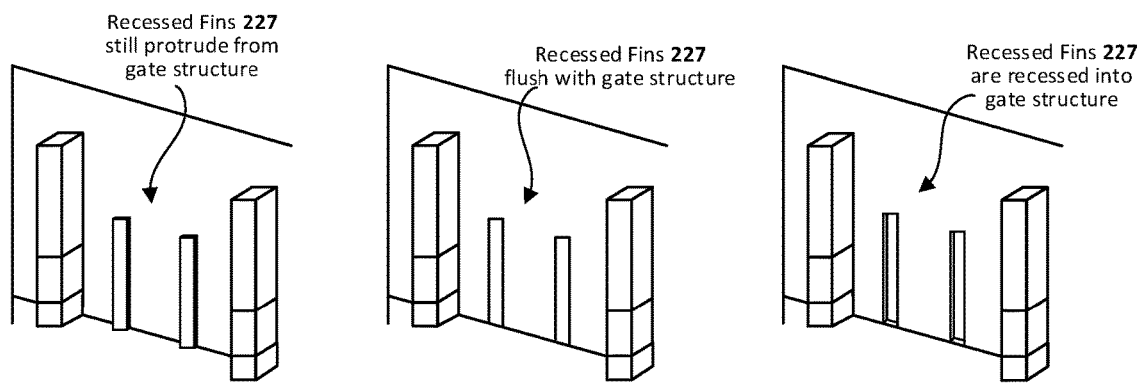

FIG. 2b shows the resulting structure after fins 227 have been horizontally recessed, such that the fins 227 now protrude only a relatively small amount (e.g., 1 to 10 nm), according to some embodiments. Such an embodiment is shown in FIG. 2b' and provides both vertical and horizontal semiconductor material (of or proximate the channel region) from which the epi source/drain regions 105 can grow. In other embodiments such as the one shown in FIG. 2b", the horizontal recessing is such that the fins 227 are flush with the fin structure 225. Such an embodiment exposes sufficient semiconductor material from which the epi source/drain regions 105 can grow. In still other embodiments such as the one shown in FIG. 2b''', the horizontal recessing is such that the fins 227 are recessed into the gate structure 225. Such an embodiment exposes sufficient semiconductor from which the epi source/drain regions 105 can grow and also allows for the heavily doped source/drain material to be closer to the channel region, as will be appreciated. In any such example cases, the etching of fins 227 can be accomplished, for instance, with standard dry and/or wet etch processing.

Figure 2C:
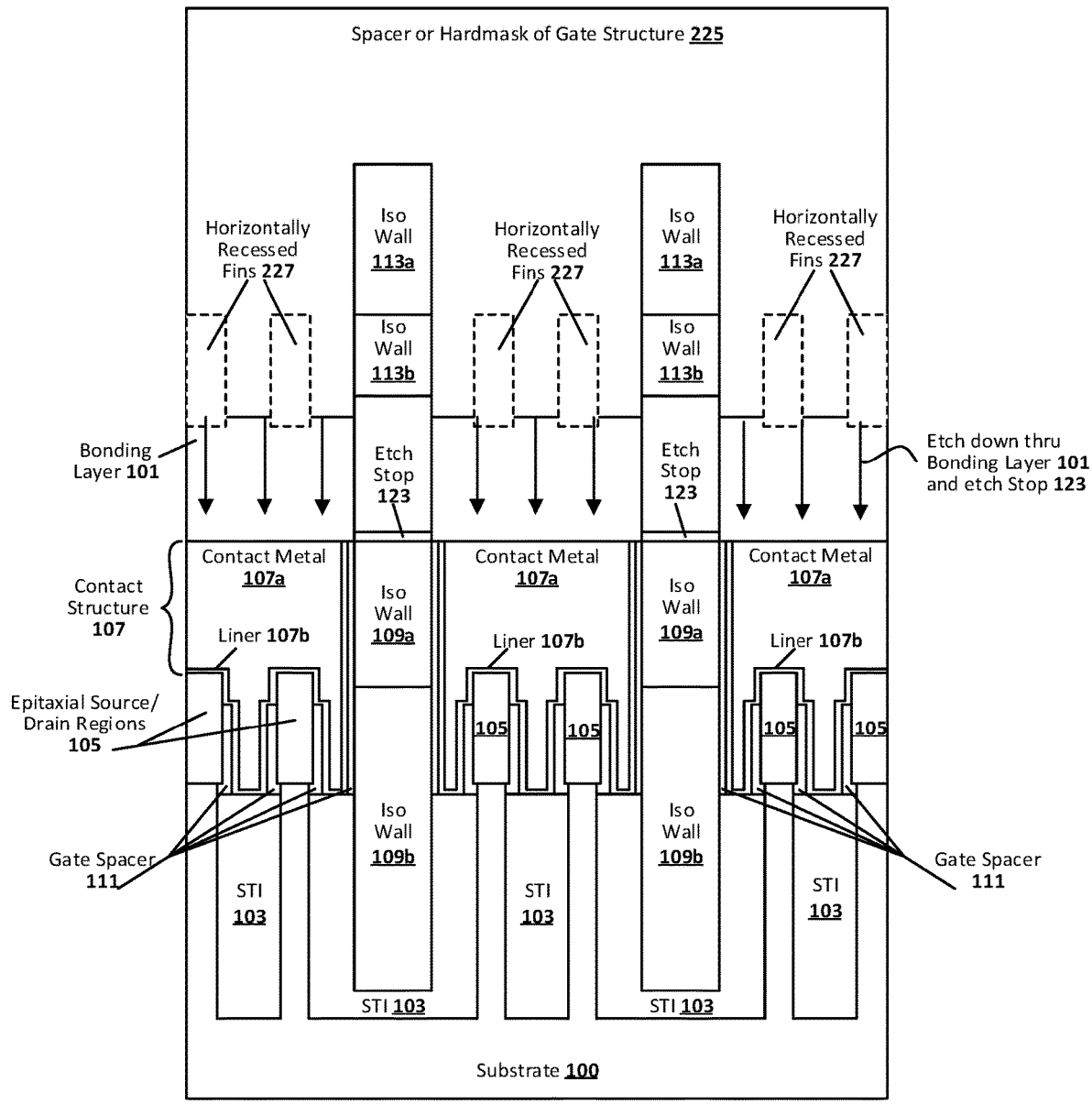

FIG. 2c shows the resulting structure after further etching is performed to vertically recess the bonding layer 101 and the etchstop layer 123, so as to expose the upper surface of the underlying contact structure 107. The etch can be, for example, a directional dry etch (anisotropic) that is vertical in nature, so as so not substantially etch in the horizontal or lateral directions, as will be appreciated. In other embodiments, a degree of lateral etching may be tolerated (wet isotropic etching). Further note that the etch process may vary to accommodate different target materials. For instance, the bonding layer 101 may be silicon dioxide that is recessed with a first etch scheme, and the etch stop 123 may be silicon nitride that is recessed with a second etch scheme. Standard etch schemes for these materials can be used. Following this etch processing, the structure may be further prepared for epitaxial deposition of the source/drain materials, such as by one or more cleaning operations, and/or one or more masking operations to isolate certain source/drain regions to be processed or protect exposed areas.

Figure 2D:
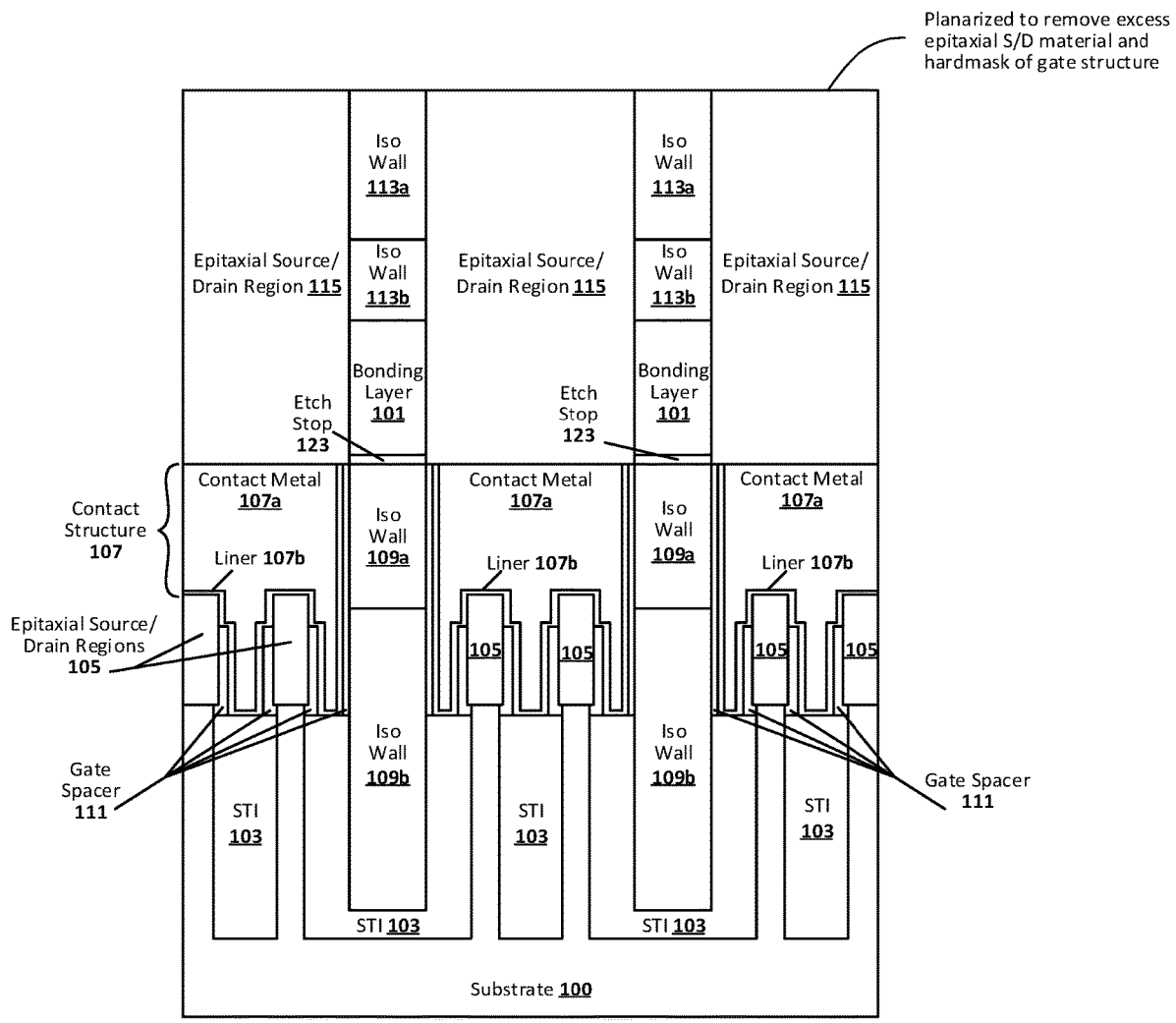

FIG. 2d shows the resulting structure after the deposition and planarization of epitaxial source/drain regions 115. This epi seeds off the horizontally recessed fins 227. In some embodiments, the deposition process may include repetitive cycles of epi deposition and etch to fill the entire recess. In other embodiments, selective epitaxial deposition may be used, such as epitaxial deposition selective to the exposed semiconductor material of or adjacent to the channel region. The precision of the deposition can vary from one embodiment to the next, as will be appreciated. As previously explained, any number of semiconductor materials can be used, including group IV semiconductor materials and group III-V semiconductor materials. As further previously explained, the source/drain regions 115 can be heavily doped (relative to the gated channel material). The dopant concentration can be, for instance, in excess of 1E18 cm$^3$, although other doping concentrations may be used, as will be appreciated. In any case, note how the epi source/drain regions 115 extend fully downward to and are in contact with the underlying contact structure 107. Thus, epi source/drain region 115 provides not only the source/drain region, but also provides the interconnect to the lower contact structure 107. The highly doped nature of the epi deposition can be used to improve the conductivity of the interconnect.

Figure 3:
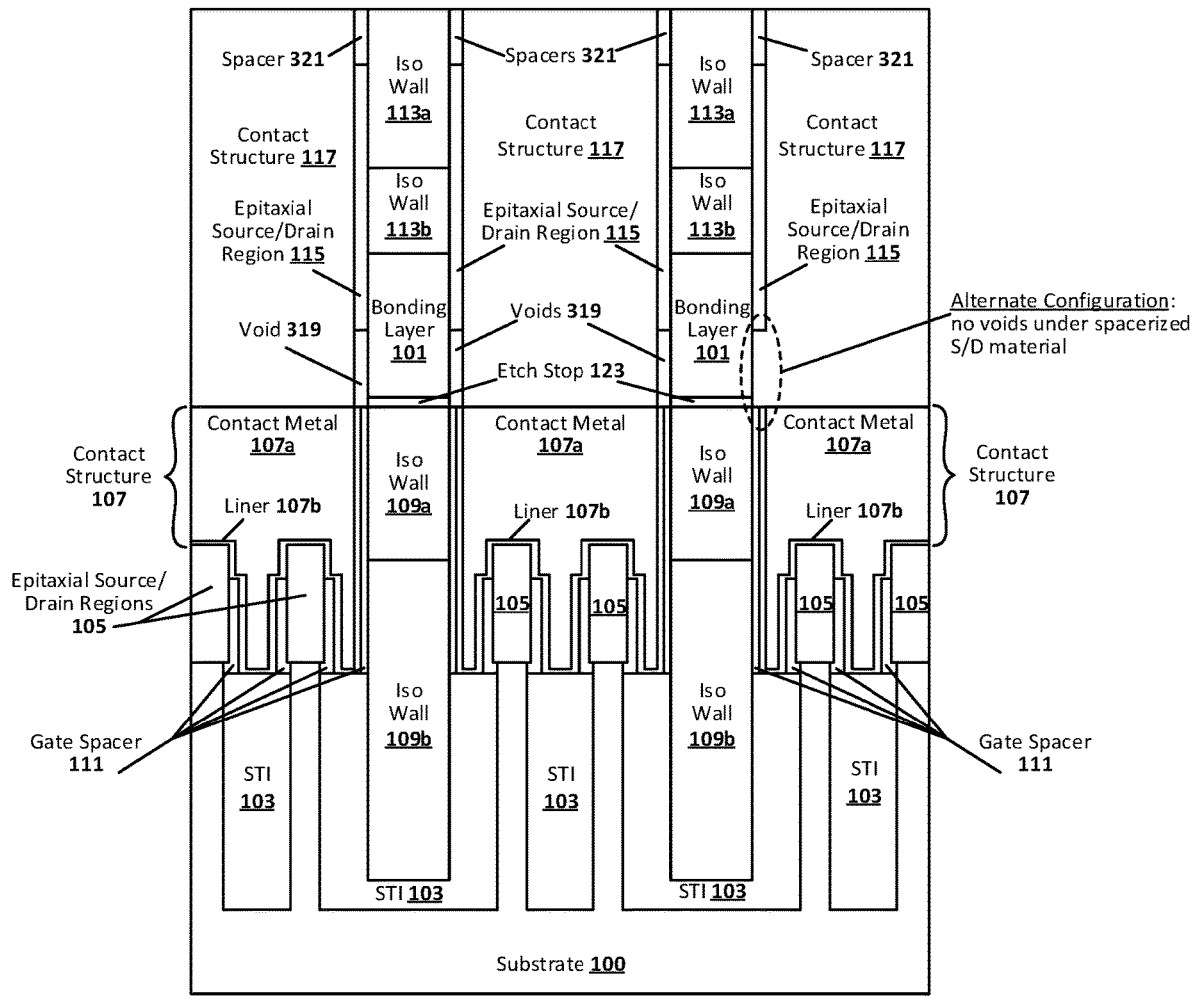
FIG. 3 illustrates a cross-section view of an integrated circuit including a vertical interconnect structure for electrically connecting source/drain regions of stacked transistors, in accordance with another embodiment of the present disclosure. The cross-section is taken parallel to the gate line and through the source/drain regions.

FIG. 3 illustrates a cross-section view of an integrated circuit including a vertical interconnect structure for electrically connecting source/drain regions of stacked transistors, in accordance with another embodiment of the present disclosure. As can be seen, this example configuration is similar to the example embodiment shown in FIG. 1, and the previous relevant discussion is therefore equally applicable here and will not be repeated. However, this embodiment of FIG. 3 is different in two main respects. First, note that the epi source/drain region 115 only extends part way down the recess and doesn't necessarily contact the underlying contact structure 107. Second, a metal contact structure 117 is formed within the epi source/drain region 115, with the use of a spacer 321. In particular, a recess is formed within the epi source/drain region 115 using spacers 321, and one or more metals is then deposited within the void to provide contact structure 117. Spacers 321 may be, for instance, silicon nitride, carbon-doped silicon oxynitride, or silicon carbide, and the metal may be any of the contact liners and/or metals previously noted, although any number of suitable spacer and contact materials can be used. In some example cases, the metal partially fills the recess and contacts the underlying contact structure 107, but leaves voids 319 (e.g., air gap) under the spacerized source/drain 115 material, particularly if the metal deposition (e.g., epi) pinches off before it completely fills the recess. In other cases, as shown in the alternate configuration on the right side of FIG. 3, the metal can be reflowed or otherwise deposited in a fashion that allows contact with the underlying contact structure 107 as well as for the recess to be completely filled.

FIGS. 4a-4d collectively illustrate a methodology for forming vertical contact or so-called interconnect between monolithically stacked transistors, according to an embodiment of the present disclosure. The cross-sections are taken parallel to the gate line and through the source/drain regions. The previous relevant discussion corresponding to FIGS. 1 and 3 with respect to example materials and configurations and forming processes is equally applicable here.

Figure 4A:
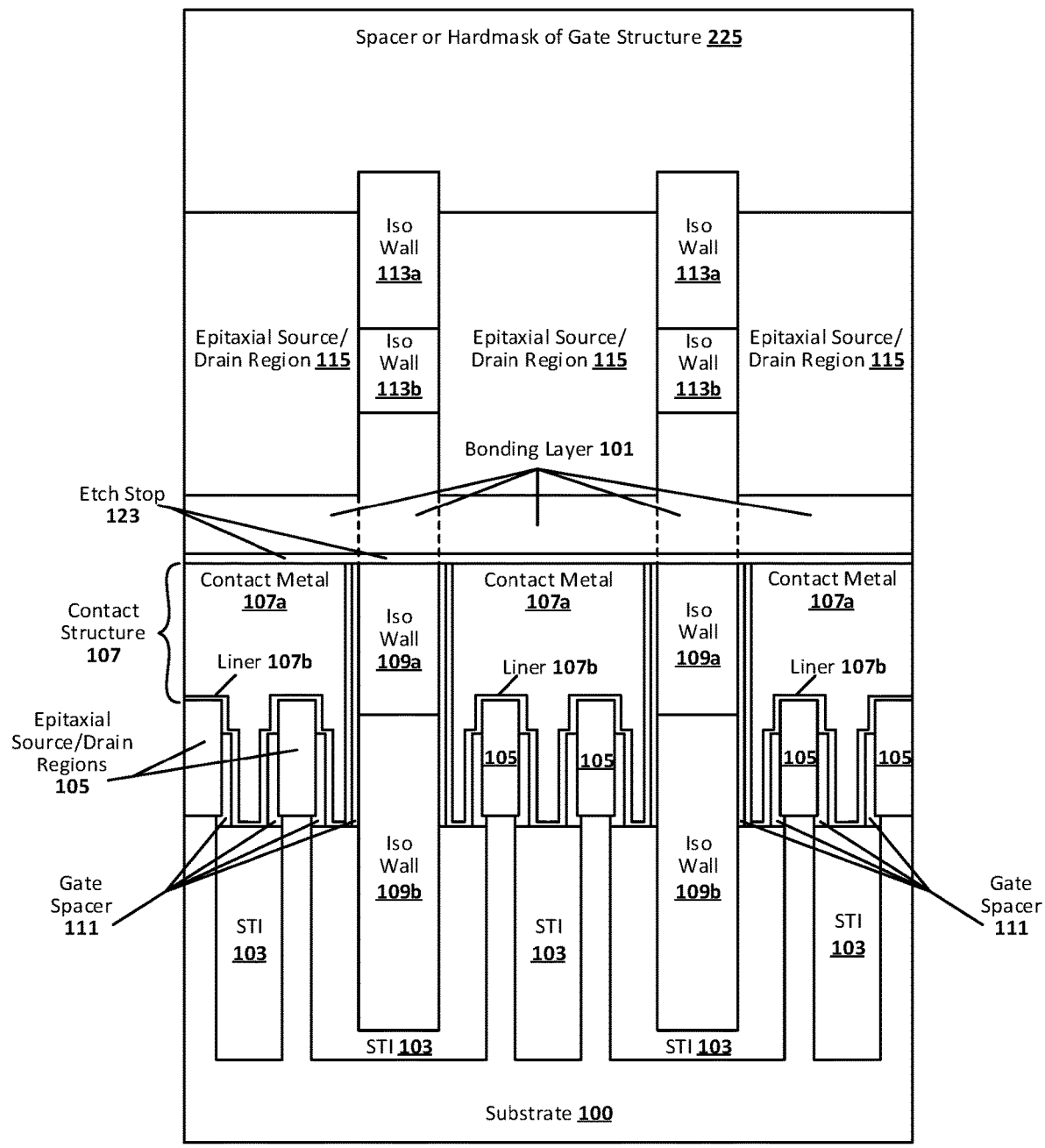
FIGS. 4a-4d collectively illustrate a methodology for forming the integrated circuit of FIG. 3, in accordance with an embodiment of the present disclosure. The cross-sections are taken parallel to the gate line and through the source/drain regions.

With reference now to FIG. 4a, a partially formed integrated circuit is shown that includes upper and lower device regions in a monolithically stacked configuration. At this point in the process, the lower device region has been separately formed, and is now bonded to the upper device region by bonding layer 101, although other layer transfer or forming processes can be used to fabricate a vertically stacked transistor structure. In any such cases, and as can further be seen in FIG. 4a, the source/drain regions of the upper device have been opened or otherwise exposed, and any fins or fin structures or other semiconductor bodies that were present in those regions have been horizontally recessed toward and possibly into the gate structure and reveal the channel region sidewall (or a semiconductor fin stub or structure adjacent to the channel region sidewall) on which the subsequent epi can seed, as previously explained. The recess passes through the bonding layer 101 and the etch stop layer 123 to effectively land on the underlying contact structure 107. In addition, epi source/drain regions 115 have been deposited so as to at least partially fill the recess. In the example embodiment shown, the epi source/drain regions 115 doesn't extend to the bottom of the recess or to the top of the recess. In other embodiments, the epi source/drain regions 115 may extend further upward and even out of the top of the recess and/or extend further downward and even to the lower contact structure 107. In some specific such embodiments, the epi source/drain 115 material substantially or completely fills the recess. In any such example cases, the epi source/drain 115 material can be subjected to a spacer-based trim to provide a recess that passes through the epi source/drain 115 material and exposed the underlying contact structure 107, as will be explained in turn.

Figure 4B:
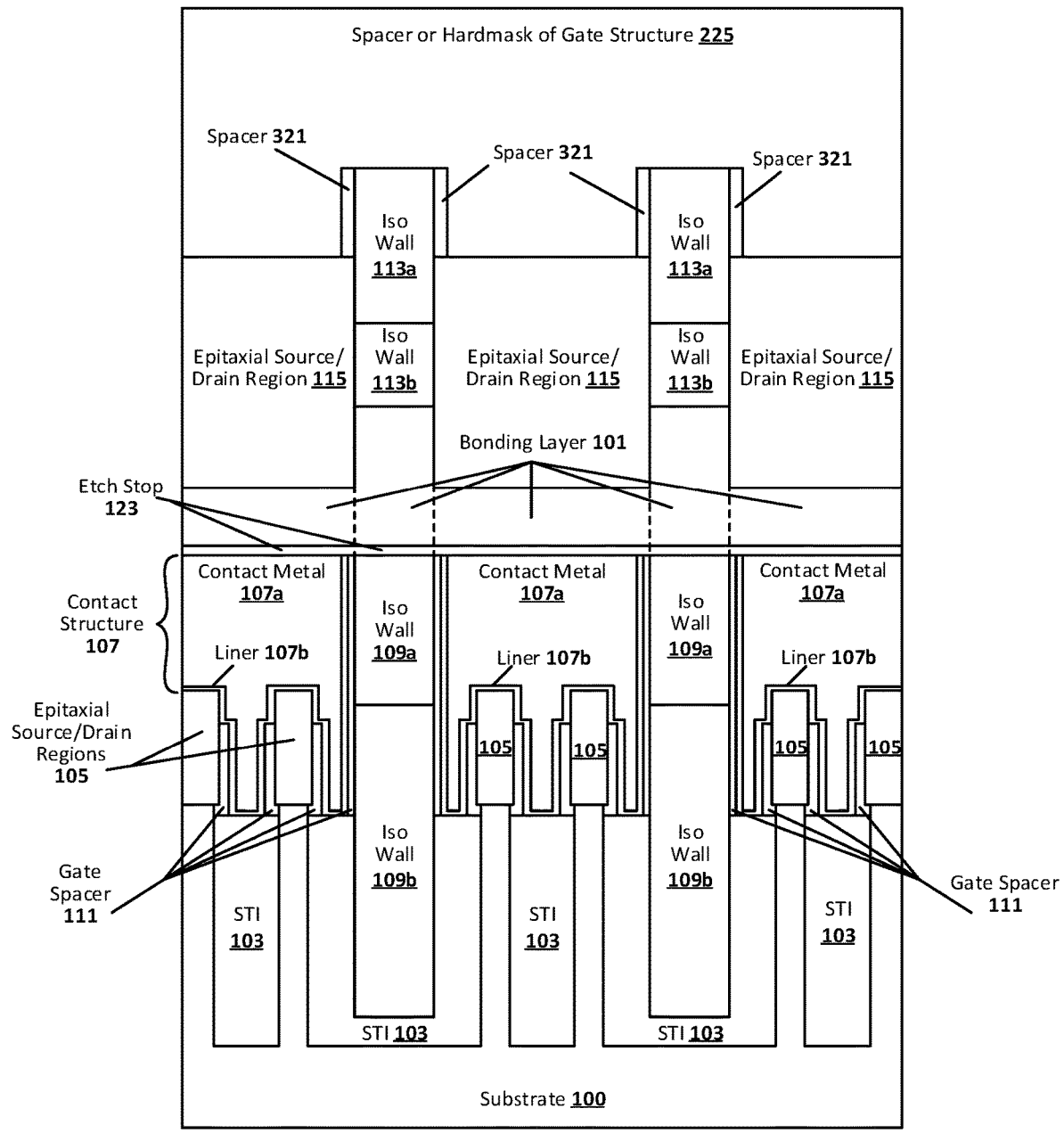

FIG. 4b shows the resulting structure after the epi is recessed to be lower than the neighboring isolation walls 113 (or insulation structure, as the case may be) to make room for spacers 321. In this example case, note that the epi source/drain 115 material is deposited so as to provide a void at the bottom of the recess above the underlying contact structure 107. As previously indicated, other embodiments may have no such void, or a different size or shaped void depending on the selectiveness of the deposition process. In any such cases, spacer 321 material is deposited into the upper recessed area, patterned and etched to provide spacers 321. Standard spacer forming techniques can be used, as will be appreciated in light of this disclosure. The vertical thickness and horizontal width of spacers 321 can vary from one embodiment to the next, but in some example cases are both in the range of 5 nm to 20 nm. In a more general sense, the spacers 321 can have any geometry that that allows them to withstand the epi trim process, so as to allow for spacerization of the epi source/drain 115 material. In some such example cases, the spacer 321 material is a nitride (e.g., SiN) or carbide (SiC) to which a given etch chemistry is selective and therefore removes the epi source/drain 115 material at a much faster rate than the spacer 321 material. Numerous such spacer materials will be apparent.

Figure 4C:
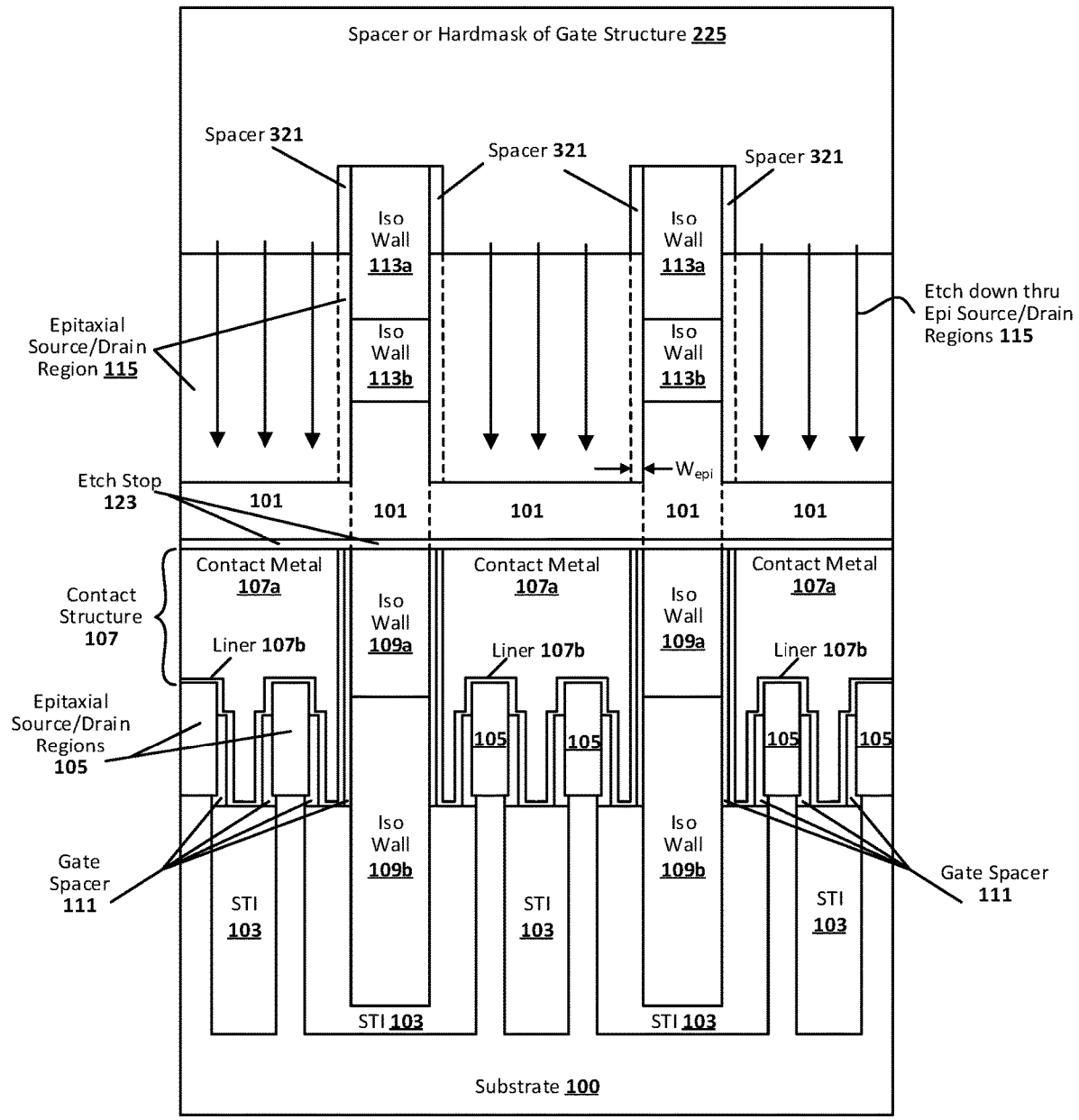

FIG. 4c shows the resulting structure after the epi source/drain 115 material has been trimmed or spacerized, via the user of spacers 321. The trim process may be carried out, for instance, using a dry etch of the epi source/drain 115 material to the lower contact structure 107. Note that an anisotropic or directional etch allows a band or strip of epi source/drain 115 material to remain on either side of the etch path, according to some embodiments. Such an etch also allows epi source/drain 115 material to remain on the previously exposed vertical portion of the channel region (or semiconductor material adjacent thereto). Other embodiments may utilize an isotropic etch, for example, is such an etch will not cause too much of the seeded source/drain 115 material to be removed, as will be appreciated. The horizontal width of these remaining epi material bands (as indicated at $W_{epi}$) can vary from one embodiment to the next, but in some cases are in the range of 3 nm to 100 nm (e.g., 10 nm to 50 nm, or 10 nm to 30 nm, or 5 nm to 20 nm). Likewise, the horizontal width between these remaining epi material bands (where metal will subsequently be deposited)

can vary from one embodiment to the next, but in some cases is in the range of 3 nm to 100 nm (e.g., 20 nm to 70 nm, or 10 nm to 30 nm, or 50 nm to 100 nm). In a more general sense, any suitable geometries may be provisioned with respect to $W_{epi}$ and the horizontal width between these remaining epi material bands, depending on factors such as the given process node and desired footprint of die.

Figure 4D:
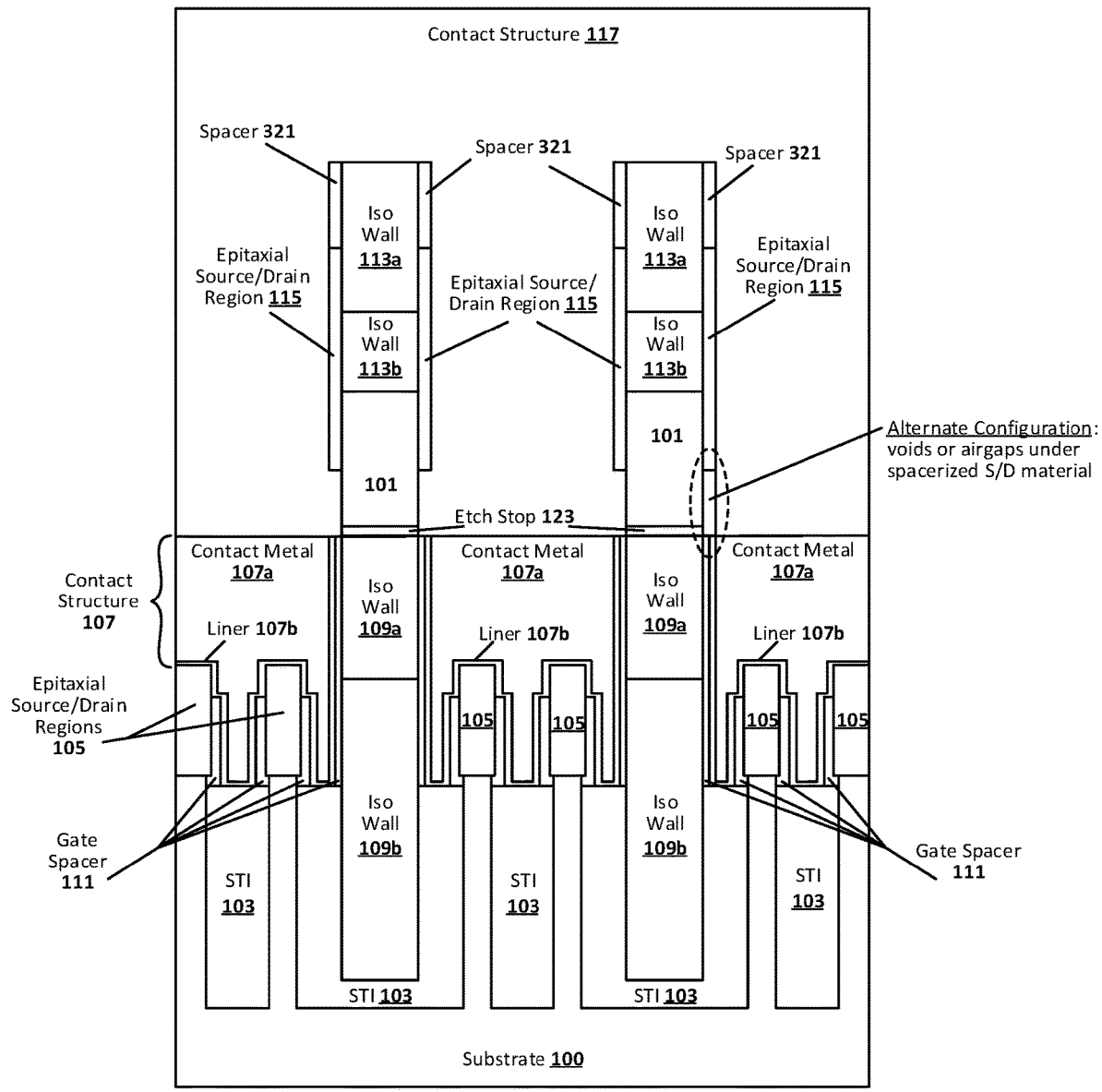

FIG. 4d shows the structure after the structure is filled with one or more conductors and/or metals to provide contact structure 117. As can be seen, the contact structure 117 provides contact from the source/drain regions 115 of top device layer to the bottom source/drain regions 105 by way of contact structure 107. In some embodiments, any excess portion of contact structure 117 can be planarized or otherwise removed, such as down to the tops of iso walls 113. In other embodiments, it may be desired to have one or more source/drain regions shorted together (so contact structure 117 could be used to join those regions by extending over the intervening iso wall 113). As can be further seen, the conductive material deposited for contact structure 117 may completely or otherwise substantially fill the space created by the saucerization of the source/drain 115 material, according to some embodiments. In some such embodiments, this complete or substantial filling can be improved by way of a reflowing of the conductive material post deposition, should the thermal budget allow for same. As used herein, substantial filled refers to a case where the volume available below the spacerized source/drain region 115 to be filled by the metal is in the range of 95% or more filled. In some cases, that available volume is more than 98% filled.

In still other embodiments, and as shown in the dashed circled portion on the right side of the structure in FIG. 4d, a void or airgap may be left under the remaining or spacerized source/drain region 115. Note this void is a detectible feature. Further note that the boundary of epi source/drain 115 material is in same plane as or collinear with the boundary of the spacer 321 material. Likewise, note that the boundary of bonding layer 101 material is in same plane as or collinear with the boundary of the spacer 321 material. As will be appreciated, this boundary determines the boundary between the epi region 115 and the contact structure 117 used for the vertical connection. Such features are detectible, for example, with transmission electron microscopy (TEM) or other such visual analysis techniques.

Numerous variations and alternative configurations will be apparent in light of this disclosure. For instance, the example illustrated in the figures show every vertical source/drain with connection formed between top and bottom. In other embodiments, only one or some of the pairs of vertical devices will be so connected. The devices to be paired can be selected via standard lithographic and masking operation, as will be further appreciated. Also, as previously stated, while the examples show fin structures for top and bottom devices, other embodiments may include any of fins, nanowires, nanoribbons, planar architectures, or any combination thereof. Also, all geometry may be rounded and corners may be blunted. For instance, the fins can be trapezoidal shaped, hourglass shaped, or another shape. Likewise, nanowires and nanoribbons can be similarly shaped, to some extent, given the smaller aspect ratio. Also, the bottom device regions are shown fabricated on a bulk substrate. In other embodiments, the bottom device regions could be fabricated on a SOI or XOI substrate, for instance.

Computing System

Figure 5:
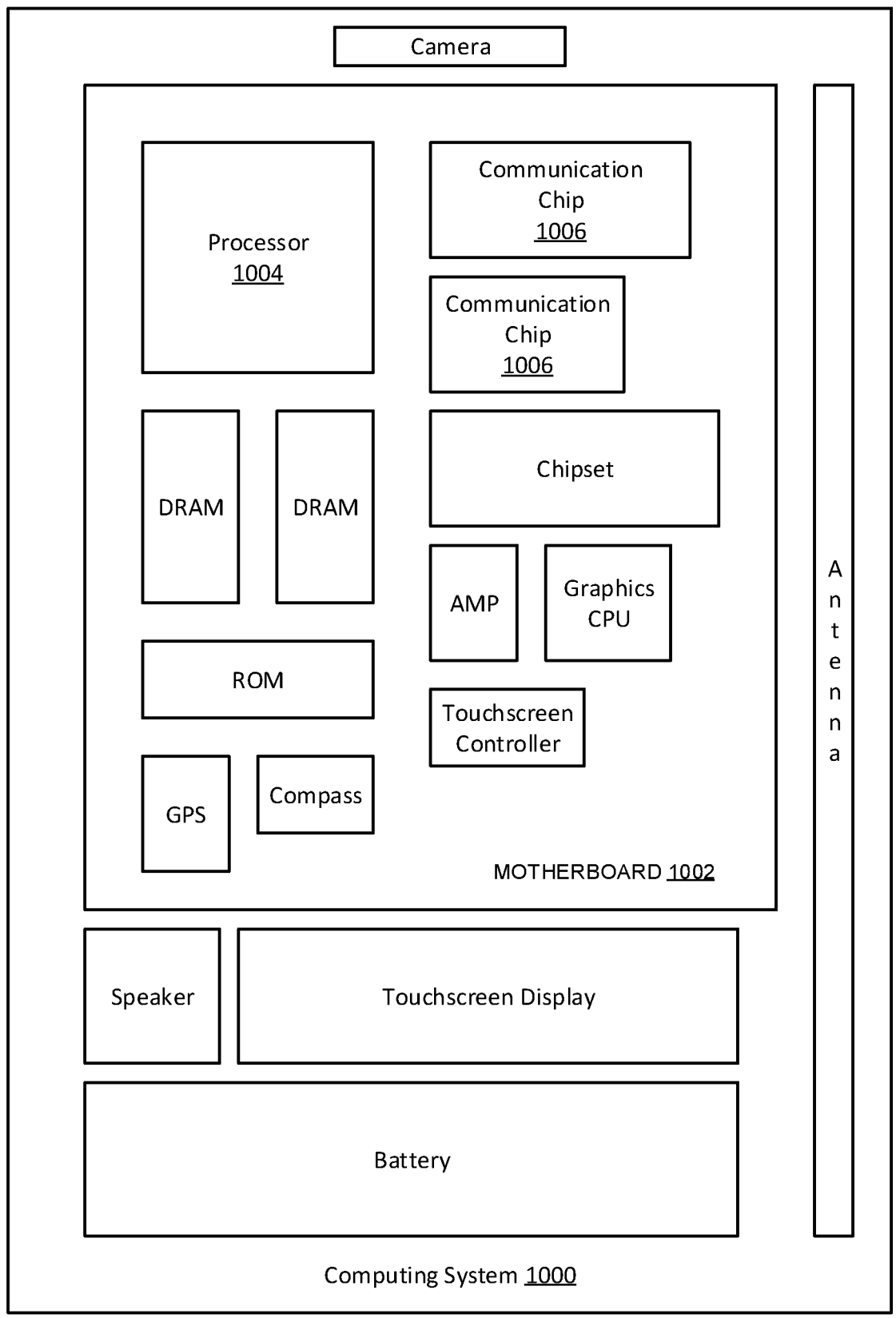
FIG. 5 illustrates a computing system implemented with one or more integrated circuit structures configured in accordance with an embodiment of the present disclosure.

FIG. 5 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuits configured with a stacked transistor structure having a vertical source/drain region interconnect feature, as variously described herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The processor 1004 of the computing system 1000 includes an integrated circuit die packaged within the processor 1004. In some example embodiments of the present disclosure, the integrated circuit die of the processor 1004 includes one or more stacked transistor structures having a vertical source/drain region interconnect feature, as variously provided herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more stacked transistor structures as variously provided herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more stacked transistor structures as variously provided herein. As will be appreciated in light of this disclosure, various embodiments of the present disclosure can be used to improve performance on products fabricated at any process node (e.g., in the micron range, or sub-micron and beyond) by allowing for the use of vertically stacked transistors having any number of source/drain configurations and channel configurations (e.g., Si, Ge, SiGe, multilayer structure of Si and SiGe, III-V such as gallium nitride or InGaAs, a semiconducting oxide such as nickel oxide or IGZO, and/or combinations thereof), wherein efficient source/drain interconnect is desired.

FURTHER EXAMPLE EMBODIMENTS

The following examples pertain to further embodiments, from which numerous permutations and configurations will be apparent.

Example 1 includes an integrated circuit structure, comprising: a first transistor device layer including a first gate structure, a first source or drain region adjacent the first gate structure and comprising a first semiconductor material, and a contact structure on the first source or drain region; and a second transistor device layer including a second gate structure, and a second source or drain region adjacent the second gate structure and comprising a second semiconductor material; wherein the first and second transistor device layers are arranged in a vertically stacked configuration, and the second semiconductor material of the second source or drain region extends downward to contact the contact structure on the first source or drain region.

Example 2 includes the subject matter of Example 1, and further comprises an isolation wall within the first transistor device layer, the contact structure on the first source or drain region being laterally adjacent to the isolation wall. Note in some embodiments the contact structure directly contacts the isolation wall, while in others there may be one or more relatively thin intervening layers between the contact structure and the isolation wall, such that the contact structure does not directly contact the isolation wall but is still relatively close (e.g., within 10 nm of isolation wall, or within 5 nm of the isolation wall, or within 2 nm of the isolation wall). Recall that the contact structure itself may include multiple layers (e.g., plug, liner, and/or barrier layers), and the noted intervening layers may be in addition to those contact structure layers, such as in the example case where the contact structure includes a plug and liner, and there is spacer material is between the liner of the contact structure and isolation wall.

Example 3 includes the subject matter of Example 1 or 2, and further comprises an isolation wall within the second transistor device layer, the second semiconductor material of the second source or drain region being laterally adjacent to the isolation wall. Note in some embodiments the second semiconductor material of the second source or drain region directly contacts the isolation wall, while in others there may be one or more relatively thin intervening layers between the second semiconductor material and the isolation wall, such that the second semiconductor material does not directly contact the isolation wall but is still relatively close (e.g., within 10 nm of isolation wall, or within 5 nm of the isolation wall, or within 2 nm of the isolation wall). In the latter case, note that the one or more intervening layers may be part of an overall source/drain region structure that further includes the second semiconductor material, such as the example case where the one or more intervening layers include, for instance, a liner or capping layer that extends between the second semiconductor material and the isolation wall.

Example 4 includes the subject matter of Example 2 or 3, wherein one or both of the isolation walls within the first and second transistor device layers comprises one or more first insulator materials that provide etch selectivity with respect to a second insulator material adjacent to the one or both of the isolation walls.

Example 5 includes the subject matter of any of the previous Examples, and further comprises a bonding layer in the second transistor device layer, the second semiconductor material of the second source or drain region being laterally adjacent to the bonding layer. Note in some embodiments the second semiconductor material of the second source or drain region directly contacts the bonding layer, while in others there may be one or more relatively thin intervening layers between the second semiconductor material and the bonding layer, such that the second semiconductor material does not directly contact the bonding layer but is still relatively close (e.g., within 10 nm, or within 5 nm, or within 2 nm of the bonding layer). In the latter case, note that the one or more intervening layers may be, for example, part of an overall source/drain region structure that further includes the second semiconductor material, such as the example case where the one or more intervening layers include, for instance, a liner or capping layer that extends between the second semiconductor material and the bonding layer.

Example 6 includes the subject matter of any of the previous Examples, wherein the contact structure on the first source or drain region is a first contact structure, the integrated circuit structure further comprising a second contact structure on an upper surface of the second source or drain region.

Example 7 includes the subject matter of any of the previous Examples, wherein one or both of the first and second contact structures comprises multiple layers.

Example 8 includes the subject matter of any of the previous Examples, wherein the first and second transistor device layers include non-planar transistor architecture, including one or more of a semiconductor fin, nanowire, and/or nanoribbon. So, for instance, in one example embodiment the first gate structure wraps around a nanowire or nanoribbon, and the second gate structure is on opposing sides and a top of a fin. Other configurations will be apparent.

Example 9 includes the subject matter of any of the previous Examples, wherein the first and second gate structures each include a gate electrode and a gate dielectric between the gate electrode and a corresponding gated region.

Example 10 includes the subject matter of Example 9, wherein the gate dielectrics comprise a high-k dielectric material.

Example 11 includes the subject matter of any of the previous Examples, wherein the second semiconductor material of the second source or drain region comprises a group IV semiconductor material.

Example 12 includes the subject matter of any of Examples 1 through 10, wherein the second semiconductor material of the second source or drain region comprises germanium.

Example 13 includes the subject matter of any of the previous Examples, wherein the first semiconductor material of the first source or drain region comprises a group III-V semiconductor material.

Example 14 includes the subject matter of any of the previous Examples, wherein the first semiconductor material of the first source or drain region comprises indium.

Example 15 includes the subject matter of any of the previous Examples, wherein first source or drain region comprises an n-type dopant, and the second source or drain region comprises a p-type dopant.

Example 16 includes an integrated circuit device, comprising: a first transistor device layer including a first gate structure, a first source or drain region adjacent the first gate structure and comprising a first semiconductor material, and a first contact structure on the first source or drain region; a second transistor device layer including a second gate structure, a second source or drain region adjacent the second gate structure and comprising a second semiconductor material, and a second contact structure; and wherein the first and second transistor device layers are arranged in a vertically stacked configuration, and the second contact structure passes through the second semiconductor material of the second source or drain region and contacts the first contact structure on the first source or drain region.

Example 17 includes the subject matter of Example 16, and further comprises an isolation wall within the first transistor device layer, the first contact structure on the first source or drain region being laterally adjacent to the isolation wall. Note in some embodiments the first contact structure directly contacts the isolation wall, while in others there may be one or more relatively thin intervening layers between the first contact structure and the isolation wall, such that the first contact structure does not directly contact the isolation wall but is still relatively close (e.g., within 10 nm, or within 5 nm, or within 2 nm of the isolation wall). Recall that the first contact structure itself may include multiple layers (e.g., plug, liner, and/or barrier layers), and the noted intervening layers may be in addition to those contact structure layers, such as in the example case where the first contact structure includes a plug and liner, and there is spacer material is between the liner of the first contact structure and isolation wall.

Example 18 includes the subject matter of Example 16 or 17, and further comprises an isolation wall within the second transistor device layer, the second semiconductor material of the second source or drain region being laterally adjacent to the isolation wall, such that the second semiconductor material is between the second contact structure and the isolation wall. Note in some embodiments the second semiconductor material of the second source or drain region directly contacts the isolation wall, while in others there may be one or more relatively thin intervening layers between the second semiconductor material and the isolation wall, such that the second semiconductor material does not directly contact the isolation wall but is still relatively close (e.g., within 10 nm of isolation wall, or within 5 nm of the isolation wall, or within 2 nm of the isolation wall). In the latter case, note that the one or more intervening layers may be part of an overall source/drain region structure that further includes the second semiconductor material, such as the example case where the one or more intervening layers include, for instance, a liner or capping layer that extends between the second semiconductor material and the isolation wall.

Example 19 includes the subject matter of Example 17 or 18, wherein one or both of the isolation walls within the first and second transistor device layers comprises one or more first insulator materials that provide etch selectivity with respect to a second insulator material adjacent to the one or both of the isolation walls.

Example 20 includes the subject matter of any of Examples 16 through 19, and further comprises a bonding layer in the second transistor device layer, the second semiconductor material of the second source or drain region being laterally adjacent to the bonding layer. Note in some embodiments the second semiconductor material of the second source or drain region directly contacts the bonding layer, while in others there may be one or more relatively thin intervening layers between the second semiconductor material and the bonding layer, such that the second semiconductor material does not directly contact the bonding layer but is still relatively close (e.g., within 10 nm, or within 5 nm, or within 2 nm of the bonding layer). In the latter case, note that the one or more intervening layers may be, for example, part of an overall source/drain region structure that further includes the second semiconductor material, such as the example case where the one or more intervening layers include, for instance, a liner or capping layer that extends between the second semiconductor material and the bonding layer.

Example 21 includes the subject matter of any of Examples 16 through 20, and further comprises a void or air gap laterally adjacent to the second contact structure and under the second semiconductor material of the second source or drain region.

Example 22 includes the subject matter of any of Examples 16 through 21, wherein one or both of the first and second contact structures comprises multiple layers.

Example 23 includes the subject matter of any of Examples 16 through 22, wherein the first and second transistor device layers include non-planar transistor architecture, including one or more of a semiconductor fin, a nanowire, and/or a nanoribbon.

Example 24 includes the subject matter of any of Example 16 through 23, wherein the first and second gate structures each include a gate electrode and a gate dielectric between the gate electrode and a corresponding gated region.

Example 25 includes the subject matter of Example 24, wherein the gate dielectrics comprise a high-k dielectric material.

Example 26 includes the subject matter of any of Examples 16 through 25, wherein the second semiconductor material of the second source or drain region comprises a group IV semiconductor material.

Example 27 includes the subject matter of any of Examples 16 through 25, wherein the second semiconductor material of the second source or drain region comprises germanium.

Example 28 includes the subject matter of any of Examples 16 through 27, wherein the first semiconductor material of the first source or drain region comprises a group III-V semiconductor material.

Example 29 includes the subject matter of any of Examples 16 through 28, wherein the first semiconductor material of the first source or drain region comprises indium.

Example 30 includes the subject matter of any of Examples 16 through 29, wherein first source or drain region comprises an n-type dopant, and the second source or drain region comprises a p-type dopant.

Example 30 includes the subject matter of any of Examples 16 through 29, wherein first source or drain region comprises an n-type dopant, and the second source or drain region comprises a p-type dopant.

Example 31 includes the subject matter of any of Examples 16 through 30, and further comprises a spacer material above the second semiconductor material of the second source or drain region, wherein a boundary of the spacer material is collinear with a boundary of the second semiconductor material of the second source or drain region.

Example 32 includes the subject matter of Example 31, and further comprises a void or air gap laterally adjacent to the second contact structure and under the second semiconductor material of the second source or drain region, wherein a boundary of the void or air gap is collinear with the boundary of the second semiconductor material of the second source or drain region.

Example 33 includes the subject matter of Example 31, wherein a portion of the second contact structure is directly underneath the second semiconductor material of the second source or drain region. So, an imaginary vertical plane passes through both the second contact structure and the second semiconductor material of the second source or drain region.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit structure, comprising:
   a first transistor device layer including a first gate structure, a first source or drain region adjacent the first gate structure and comprising a first semiconductor material, and a contact structure on the first source or drain region, the first source or drain region having a lateral width along a direction; and
   a second transistor device layer including a second gate structure, and a second source or drain region adjacent the second gate structure and comprising a second semiconductor material, the second source or drain region having a lateral width along the direction greater than the lateral width of the first source or drain region along the direction;
   wherein the first and second transistor device layers are arranged in a vertically stacked configuration, the second semiconductor material of the second source or drain region extends downward to directly contact the contact structure on the first source or drain region, and the contact structure is vertically between the first source or drain region and the second semiconductor material of the second source or drain region.

2. The integrated circuit structure of claim 1, further comprising an isolation wall within the first transistor device layer, the contact structure on the first source or drain region being laterally adjacent to the isolation wall, and/or an isolation wall within the second transistor device layer, the second semiconductor material of the second source or drain region being laterally adjacent to the isolation wall.

3. The integrated circuit structure of claim 2, wherein one or both of the isolation walls within the first and second transistor device layers comprises one or more first insulator materials that provide etch selectivity with respect to a second insulator material adjacent to the one or both of the isolation walls.

4. The integrated circuit structure of claim 1, further comprising a bonding layer in the second transistor device layer, the second semiconductor material of the second source or drain region being laterally adjacent to the bonding layer.

5. The integrated circuit structure of claim 1, wherein the contact structure on the first source or drain region is a first contact structure, the integrated circuit structure further comprising a second contact structure on an upper surface of the second source or drain region.

6. The integrated circuit structure of claim 1, wherein the first and second transistor device layers include non-planar transistor architecture, including one or more of a semiconductor fin, nanowire, and/or nanoribbon.

7. The integrated circuit structure of claim 1, wherein the first and second gate structures each include a gate electrode and a gate dielectric between the gate electrode and a corresponding gated region, and wherein the gate dielectrics comprise a high-k dielectric material.

8. The integrated circuit structure of claim 1, wherein the first semiconductor material of the first source or drain region comprises a group III-V semiconductor material, and the second semiconductor material of the second source or drain region comprises a group IV semiconductor material.

9. The integrated circuit structure of claim 1, wherein first source or drain region comprises an n-type dopant, and the second source or drain region comprises a p-type dopant.

10. An integrated circuit device, comprising:
    a first transistor device layer including a first gate structure, a first source or drain region adjacent the first gate structure and comprising a first semiconductor material, and a first contact structure on the first source or drain region, the first source or drain region having a lateral width along a direction;
    a second transistor device layer including a second gate structure, a second source or drain region adjacent the second gate structure and comprising a second semiconductor material, and a second contact structure, the second source or drain region having a lateral width along the direction greater than the lateral width of the first source or drain region along the direction; and
    wherein the first and second transistor device layers are arranged in a vertically stacked configuration, the second contact structure passes through the second semiconductor material of the second source or drain region and directly contacts the first contact structure on the first source or drain region, and the first contact structure is vertically between the first source or drain region and the second semiconductor material of the second source or drain region.

11. The integrated circuit structure of claim 10, further comprising an isolation wall within the first transistor device layer, the first contact structure on the first source or drain region being laterally adjacent to the isolation wall, and/or an isolation wall within the second transistor device layer, the second semiconductor material of the second source or drain region being laterally adjacent to the isolation wall, such that the second semiconductor material is between the second contact structure and the isolation wall.

12. The integrated circuit structure of claim 11, wherein one or both of the isolation walls within the first and second transistor device layers comprises one or more first insulator materials that provide etch selectivity with respect to a second insulator material adjacent to the one or both of the isolation walls.

13. The integrated circuit structure of claim 10, further comprising a bonding layer in the second transistor device layer, the second semiconductor material of the second source or drain region being laterally adjacent to the bonding layer.

14. The integrated circuit structure of claim 10, further comprising a void or air gap laterally adjacent to the second contact structure and under the second semiconductor material of the second source or drain region.

15. The integrated circuit structure of claim 10, wherein the first and second transistor device layers include non-planar transistor architecture, including one or more of a semiconductor fin, a nanowire, and/or a nanoribbon.

16. The integrated circuit structure of claim 10, wherein the first and second gate structures each include a gate electrode and a gate dielectric between the gate electrode and a corresponding gated region, wherein the gate dielectrics comprise a high-k dielectric material.

17. The integrated circuit structure of claim 10, wherein the first semiconductor material of the first source or drain region comprises a group III-V semiconductor material, the second semiconductor material of the second source or drain region comprises a group IV semiconductor material, the first source or drain region comprises an n-type dopant, and the second source or drain region comprises a p-type dopant.

18. The integrated circuit structure of claim 10, further comprising a spacer material above the second semiconductor material of the second source or drain region, wherein a boundary of the spacer material is collinear with a boundary of the second semiconductor material of the second source or drain region.

19. The integrated circuit structure of claim 18, further comprising a void or air gap laterally adjacent to the second contact structure and under the second semiconductor material of the second source or drain region, wherein a boundary of the void or air gap is collinear with the boundary of the second semiconductor material of the second source or drain region.

20. The integrated circuit structure of claim 18, wherein a portion of the second contact structure is directly underneath the second semiconductor material of the second source or drain region.

21. An integrated circuit structure, comprising:
a first transistor device layer including a first gate structure, a first source or drain region adjacent the first gate structure and comprising a first semiconductor material, and a contact structure on the first source or drain region;
a second transistor device layer including a second gate structure, and a second source or drain region adjacent the second gate structure and comprising a second semiconductor material;
wherein the first and second transistor device layers are arranged in a vertically stacked configuration, and the second semiconductor material of the second source or drain region extends downward to contact the contact structure on the first source or drain region; and
an isolation wall within the first transistor device layer, the contact structure on the first source or drain region being laterally adjacent to the isolation wall, and/or an isolation wall within the second transistor device layer, the second semiconductor material of the second source or drain region being laterally adjacent to the isolation wall, wherein one or both of the isolation walls within the first and second transistor device layers comprises one or more first insulator materials that provide etch selectivity with respect to a second insulator material adjacent to the one or both of the isolation walls.

22. An integrated circuit device, comprising:
a first transistor device layer including a first gate structure, a first source or drain region adjacent the first gate structure and comprising a first semiconductor material, and a first contact structure on the first source or drain region;
a second transistor device layer including a second gate structure, a second source or drain region adjacent the second gate structure and comprising a second semiconductor material, and a second contact structure;
wherein the first and second transistor device layers are arranged in a vertically stacked configuration, and the second contact structure passes through the second semiconductor material of the second source or drain region and contacts the first contact structure on the first source or drain region; and
an isolation wall within the first transistor device layer, the first contact structure on the first source or drain region being laterally adjacent to the isolation wall, and/or an isolation wall within the second transistor device layer, the second semiconductor material of the second source or drain region being laterally adjacent to the isolation wall, such that the second semiconductor material is between the second contact structure and the isolation wall, wherein one or both of the isolation walls within the first and second transistor device layers comprises one or more first insulator materials that provide etch selectivity with respect to a second insulator material adjacent to the one or both of the isolation walls.

23. An integrated circuit device, comprising:
a first transistor device layer including a first gate structure, a first source or drain region adjacent the first gate structure and comprising a first semiconductor material, and a first contact structure on the first source or drain region;
a second transistor device layer including a second gate structure, a second source or drain region adjacent the second gate structure and comprising a second semiconductor material, and a second contact structure;
wherein the first and second transistor device layers are arranged in a vertically stacked configuration, and the second contact structure passes through the second semiconductor material of the second source or drain region and contacts the first contact structure on the first source or drain region; and
a void or air gap laterally adjacent to the second contact structure and under the second semiconductor material of the second source or drain region.

24. An integrated circuit device, comprising:
a first transistor device layer including a first gate structure, a first source or drain region adjacent the first gate structure and comprising a first semiconductor material, and a first contact structure on the first source or drain region, the first source or drain region having a lateral width along a direction;
a second transistor device layer including a second gate structure, a second source or drain region adjacent the second gate structure and comprising a second semiconductor material, and a second contact structure, the second source or drain region having a lateral width along the direction greater than the lateral width of the first source or drain region along the direction;
wherein the first and second transistor device layers are arranged in a vertically stacked configuration, and the second contact structure passes through the second semiconductor material of the second source or drain region and contacts the first contact structure on the first source or drain region, and the contact structure is vertically between the first source or drain region and the second semiconductor material of the second source or drain region; and
a spacer material above the second semiconductor material of the second source or drain region, wherein a boundary of the spacer material is collinear with a boundary of the second semiconductor material of the second source or drain region.

\* \* \* \* \*